(12) United States Patent
Suzuki et al.

(10) Patent No.: US 7,336,128 B2
(45) Date of Patent: Feb. 26, 2008

(54) FEED FORWARD AMPLIFIER FOR MULTIPLE FREQUENCY BANDS

(75) Inventors: Yasunori Suzuki, Yokohama (JP); Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 53 days.

(21) Appl. No.: 11/445,183

(22) Filed: Jun. 2, 2006

(65) Prior Publication Data
US 2006/0273853 A1    Dec. 7, 2006

(30) Foreign Application Priority Data
Jun. 3, 2005    (JP)    ............... 2005-164786

(51) Int. Cl.
*H03F 1/00*    (2006.01)
(52) U.S. Cl. ..................... 330/151; 330/149
(58) Field of Classification Search ............... 330/151, 330/149; 455/114.3
See application file for complete search history.

(56) References Cited

U.S. PATENT DOCUMENTS

| | | | |
|---|---|---|---|
| 6,066,984 A | 5/2000 | Tomaru et al. | |
| 6,208,204 B1 | 3/2001 | Suzuki et al. | |
| 6,320,464 B1 | 11/2001 | Suzuki et al. | |
| 6,326,845 B1 * | 12/2001 | Miyaji et al. | 330/151 |
| 6,392,483 B2 | 5/2002 | Suzuki et al. | |
| 6,515,544 B1 | 2/2003 | Suzuki et al. | |
| 6,838,934 B2 | 1/2005 | Suzuki et al. | |
| 7,126,422 B2 * | 10/2006 | Suzuki et al. | 330/151 |
| 7,183,847 B2 * | 2/2007 | Suzuki et al. | 330/149 |
| 2004/0135631 A1 | 7/2004 | Matsuura et al. | |
| 2005/0163254 A1 | 7/2005 | Suzuki et al. | |

FOREIGN PATENT DOCUMENTS

| EP | 0 552 059 A1 | 7/1993 |
|---|---|---|
| EP | 1 030 441 A2 | 8/2000 |

(Continued)

OTHER PUBLICATIONS

Yasunori Suzuki, et al., "A Dual-Band Feed-Forward Amplifier", 2005 General Meeting of the Institute of Electronics Information and Communication Engineers, C-2-2, Mar. 2005, p. 35 (with English translation).

(Continued)

*Primary Examiner*—Henry Choe
(74) *Attorney, Agent, or Firm*—Oblon, Spivak, McClelland, Maier & Neustadt, P.C.

(57) ABSTRACT

The present invention has for its object to provide, in an environment where plural radio systems coexist, a feed forward amplifier for multiple frequency bands, capable of adaptively selecting the frequency band which is used.

The feed forward amplifier of the present invention comprises a distortion detection circuit and a distortion elimination circuit and has first and second variable frequency band extractors 25a and 25b provided in series with respective vector adjustment paths 21a and 21b. Also, the feed forward amplifier comprises a frequency band controller which varies the frequency band of variable frequency band extractors 25a and 25b and has been designed, by changing the frequency band of first and second variable frequency band extractors 25a and 25b in response to a frequency switching request from the outside, to be able to adaptively control the frequency band in which distortion is compensated.

14 Claims, 17 Drawing Sheets

FOREIGN PATENT DOCUMENTS

| | | |
|---|---|---|
| EP | 1 152 523 A1 | 11/2001 |
| JP | 1-198809 | 8/1989 |
| JP | 11-330869 | 11/1999 |
| JP | 2000-223961 | 8/2000 |
| JP | 2001-284975 | 10/2001 |

OTHER PUBLICATIONS

U.S. Appl. No. 11/445,183, filed Jun. 2, 2006, Suzuki et al.
U.S. Appl. No. 11/445,402, filed Jun. 2, 2006, Suzuki et al.

* cited by examiner

FEED FORWARD AMPLIFIER FOR MULTIPLE FREQUENCY BANDS

BACKGROUND OF THE INVENTION

1. Field of the Invention

The present invention pertains to a power amplifier for mobile communications which adaptively changes the frequency band among a plurality of frequency bands. In particular, it pertains to a feed forward amplifier for multiple frequency bands which collectively amplifies a plurality of frequency bands.

2. Description of Related Art

The base configuration of a conventionally used feed forward amplifier is shown in FIG. 1. The feed forward amplifier includes two signal processing circuits. One is a distortion detection circuit 150 and the other is a distortion elimination circuit 151. Distortion detection circuit 150 is composed of a main amplifier signal path 153 and a linear signal path 154. Distortion elimination circuit 151 is composed of a main signal path 158 and a distortion injection path 159. Main amplifier signal path 153 (also called a vector adjustment path) is composed of a vector adjuster 155 and a main amplifier 156. Vector adjuster 155 is composed of a variable phase shifter 155a and a variable attenuator 155b. Linear signal path 154 is composed of delay lines. Also, main signal path 158 is composed of delay lines. Distortion injection path 159 (also called a vector adjustment path) is composed of a vector adjuster 200 and an auxiliary amplifier 201. Vector adjuster 200 is composed of a variable phase shifter 200a and a variable attenuator 200b. Here, a divider 152, a power combiner/divider 157, and a combiner 202 are simple lossless power dividers and power combiners composed of transformer circuits and hybrid circuits.

First, an explanation of the basic operation of the feed forward amplifier will be given. The signal input into the feed forward amplifier is divided into main amplifier signal path 153 and linear signal path 154 by means of divider 152. At this point, variable phase shifter 155a and variable attenuator 155b of main amplifier signal path 153 are adjusted so that the signals of main amplifier signal path 153 and linear signal path 154 have equal amplitude and opposite phase. As methods for bringing the paths to opposite phases, there is the method wherein divider 152 or power combiner/divider 157 sets a phase shift appropriately between the input and output terminals or the method wherein main amplifier 156 inverts the phase.

Since distortion detection circuit 150 is configured in this way, power combiner/divider 157 can output the differential component of the signal passing through main amplifier signal path 153 and the signal passing through linear signal path 154. This differential component is precisely the distortion component generated in main amplifier 156. Due to this fact, the block from divider 152 to power combiner/divider 157 shown in FIG. 1 is called a distortion detection circuit.

Next, an explanation regarding distortion elimination circuit 151 will be given. The output of distortion elimination circuit 150 is divided, via power combiner/divider 157, into main signal path 158 and distortion injection path 159. The output of main amplifier 156 from main amplifier signal path 153 (the signal passing through main amplifier signal path 153) is input into main signal path 158. Also, the differential component of main amplifier 156 detected in distortion detection circuit 150 (the differential component of the signal passing through main amplifier signal path 153 and the signal passing through linear signal path 154) is input into distortion injection path 159. As for variable phase shifter 200a and variable attenuator 200b of distortion injection path 159, the distortion components of the signal passing through main signal path 158 and the signal passing through distortion injection path 159 are adjusted so as have equal amplitude and opposite phase. By making an adjustment in this way, combiner 202 can combine the signal passing through main amplifier signal path 153 with the distortion component of main amplifier 156 having equal amplitude and opposite phase. And then, combiner 202 outputs a signal in which the distortion components of the whole amplifier are cancelled. Further, even if it is a matter of common knowledge, a linear amplifier is used as an auxiliary amplifier in order to eliminate the distortion component generated in the main amplifier used in a feed forward amplifier. The aforementioned operation is an ideal operation of a feed forward amplifier. In practice, it is not simple to completely maintain a balance of the distortion detection circuit and the distortion elimination circuit. Also, even if tentatively the initial settings are perfect, since the properties of the amplifier change due to fluctuations in ambient temperature, power supply, and the like, it is extremely difficult to preserve an excellent balance which is stable over time.

As methods for maintaining a highly accurate balance of the distortion detection circuit and the distortion elimination circuit of this feed forward amplifier, there is known an self-adjusting method using a pilot signal. E.g., there exist the Japanese Patent Application Laid-Open Publication No. 1 (1989)-198809 (Patent Reference 1) and the like. As devices putting these methods into practical use, there is known the article "Extremely Low-Distortion Multi-Carrier Amplifier For Mobile Communication Systems—Self-adjusting Feed-Forward Amplifier (SAFF-A)" by Toshio Nojima and Shoichi Narahashi, Institute of Electronics, Information, and Communication Engineers, Wireless Communication Systems Society, RCS90-4, 1990 (Non-patent Reference 1). These feed forward amplifiers were put into practice in the 800 MHz band and the 1.5 GHz band of the PDC (Personal Digital Cellular) mobile communications standard in Japan. This kind of feed forward amplifier is generally designed and adjusted to amplify separately for each frequency band.

The feed forward amplifiers of Japanese Patent Application Laid-Open Publication No. 2000-223961 (Patent Reference 2) and Japanese Patent Application Laid-Open Publication No. 2001-284975 (Patent Reference 3) fragment a single transmission band, e.g. 20 MHz inside the 2 GHz band, by means of a plurality of band pass filters, and amplify the fragmented and extracted signals. And then, the same amplifier compensates, separately for each fragmented frequency, the amplitude divergence and the phase divergence generated in the amplifier to raise the distortion compensation accuracy.

In the radio systems developed this far, a single system in accordance with any one of PDC, GSM (Global System for Mobile communications), IMT-2000 (International Mobile Telecommunications 2000), and the like, was used. As against this, there is the technology of carrying out a transfer to software of some functionality of radio devices so that it becomes possible for a single hardware to handle a plurality of radio systems. If it is possible for a single hardware to handle a plurality of radio systems, the user can use the mobile communication environment without any awareness of the radio system or the core network in the background thereof. However, a single hardware actually handling a plurality of radio systems is something that has not reached implementation.

Also, it can be considered that, for each region or operator, the services offered with the radio system will be different and that the radio systems will also gradually become diversified. For this reason, it can be considered that, in the future, there will arise a need to make radio systems coexist which are optimal for each purpose, at the same time and in the same place.

As methods of using these plural radio systems, there is the multiband radio system. This radio system adaptively changes the frequency band used or the number of frequency bands used in response to the propagation environment and the traffic conditions. Also, in order to ensure a prescribed transmission quality or transmission volume, multiband transmission using frequency bands not in use is effective. Consequently, in a multiband radio system, in order to ensure the transmission quality or transmission volume to be guaranteed by the same radio system, the number of frequency bands is changed. Moreover, changes are also carried out in the same way within the same frequency band. Further, a multiband radio system, in case there coexist frequency bands used by several operators, can raise the frequency utilization efficiency by carrying out adaptive control using available frequency bands by means of interference recognition technology, frequency sharing technology, interference cancellation technology, produced interference reduction and avoidance technology, multiband control technology, and the like.

The feed forward amplifier is used as a linear amplifier for base stations handling multiband radio systems like this. However, in case the plural frequency bands to be amplified are widely separated, compared to the bandwidth of each frequency band, the adjustment levels of the variable phase shifter and the variable attenuator for keeping the balance of the distortion detection circuit and the distortion elimination circuit within a designated range vary with the frequency band to be amplified, because the electrical length of the delay line for each frequency band differs.

To put it in concrete terms, in case a delay line is used in common for all frequency bands, there is, due to the frequency differences of the input signals, ordinarily a need for the setting value of the vector adjuster to track a signal rotating with the angular velocity of the frequency difference. However, in the vector adjusters developed this far, it has not been possible to track a signal rotating at a velocity like that. Also, as for the vector adjusters discussed this far, it has not been possible to simultaneously set an optimal amplitude and phase, with respect to plural input signals, for structural reasons.

E.g., in case 800 MHz band and 1.5 GHz band signals are input into the same vector adjuster, it is possible to carry out optimal vector adjustment with respect to any one of the frequency bands. However, it is not possible to carry out optimal vector adjustment which tracks a frequency difference of 700 MHz. Consequently, the conventional feed forward amplifier has not been able to simultaneously amplify the 800 MHz band signal and the 1.5 GHz band signal at or below a prescribed distortion compensation level.

As a method of resolving this, a dual-band feed forward amplifier is proposed in the article "A Dual-Band Feed-Forward Amplifier" by Yasunori Suzuki and Shoichi Narahashi, the 2005 General Meeting of the Institute of Electronics Information and Communication Engineers, C-2-2, March 2005 (Non-patent Reference 2). With this configuration, there is proposed, for each frequency band, a vector adjuster having a band extraction means. In other words, this dual-band feed forward amplifier extracts the signal of the vector adjusted frequency band from the input signals of two frequency bands by means of a filter provided in a pre-stage of the vector adjuster. And then, vector adjustment is carried out for each frequency band. This dual-band feed forward amplifier configuration is capable of distortion compensation in a plurality of frequency bands. Further, the compensated band is fixed by the filter.

In multiband radio systems having a plurality of transmission bands, it can be considered to change the frequency band due to the service situation of the radio system, interference of other radio systems, and the like. However, as mentioned above, the bandwidth of the distortion compensation of the feed forward amplifier is determined by the adjustment accuracy of each loop of the distortion detection circuit and the distortion elimination circuit. Consequently, in the conventional feed forward amplifier, the adjustment of distortion compensation could not be made to correspond with the frequency band changes. Also, it was not possible for the conventional dual-band feed forward amplifier in which the distortion compensated frequency band was fixed to adaptively change the operating frequency. For a feed forward amplifier used over a long time, the change in frequency band accompanies repairs or a change of the feed forward amplifier in the base station. Consequently, an enormous amount of labor and time is required to readjust a large number of feed forward amplifiers. A feed forward amplifier configuration making this kind of labor and time expense unnecessary was required.

E.g., in case, for a dual-band feed forward amplifier which simultaneously compensates the distortion of a signal in a frequency band f1 and a signal in a frequency band f2, the frequency band was changed from f2 to f3, it has not been possible to simultaneously compensate the distortion of the signal in frequency band f1 and the signal in frequency band f3. This was so because loop adjustment by the frequency difference of f1 and f3 was not possible, as mentioned above, due to the fact that the operating frequencies of a conventional dual-band feed forward amplifier are fixed.

Also, there can be considered the method of providing, in the dual-band feed forward amplifier, fixed filter and vector adjusters handling all the frequency bands that may be thought to be available for future service. However, having fixed filters and vector adjusters able to handle all the frequency bands amounts to having fixed filters and vector adjusters which are not used something which runs counter to configuring a cost-effective feed forward amplifier. There was demanded a feed forward amplifier with no need for the exchange of constituent parts and having no redundancy to accompany in this way the changes in frequency band or the increase and/or decrease in the number of carrier waves.

BRIEF SUMMARY OF THE INVENTION

The present invention pertains to a feed forward amplifying device comprising a distortion detection circuit and a distortion elimination circuit. First variable frequency band extractors, extracting specific frequency bands, and first vector adjusters are respectively provided in N first vector adjustment paths of the distortion detection circuit. Also, N second variable is frequency band extractors, extracting specific frequency bands, and second vector adjusters are respectively provided in N second vector adjustment paths of the distortion elimination circuit. And then, the frequency bands extracted with the N first variable frequency band extractors and the N second variable frequency band extractors are adaptively controlled by a frequency control part.

According to the present invention, it is possible to implement a feed forward amplifier making possible adaptive distortion compensation, even with respect to changes among a plurality of frequency bands. The configuration of a feed forward amplifier collectively amplifying a plurality of frequency bands is simplified, so a reduction in power consumption can be implemented. According to the configuration of the present invention, it is possible to make an adjustment to a specific distortion compensation level for each frequency band, independently of the electric length difference of the delay lines constituting a linear signal path. By the fact that it is possible to change the center frequency or the bandwidth of the frequency band extractor, an adjustment can be made to a specific compensation level for each frequency band.

In this way, the feed forward amplifier of the present invention is capable of linearly amplifying a frequency band corresponding to the service situation of the radio system. Consequently, the present invention can make unnecessary additional equipment that would accompany a change in the frequency band and an increase in carrier waves.

Also, the present invention uses variable filters in the feed forward amplifier in order to make changes in the frequency band simple and inexpensive. Also, the pass band of the variable filter is controlled so as to match the used band. Consequently, even with one feed forward amplifier, it is possible to handle the frequency changes of the radio system. Also, since the feed forward amplifier of the present invention can also switch the operating band due to an instruction from an operations center to switch the frequency bands, the need to spend an enormous amount of labor on radio system adjustments disappears. In addition, since the feed forward amplifier of the present invention can detect the frequency band of the received signal and automatically switch the frequency band, it is also possible to change the frequency band dynamically, even if the transmitter side changes the frequency band. Also, rather than configuring a feed forward amplifier for each frequency band, the case of making an implementation with a single feed forward amplifier is more advantageous from the viewpoints of device scale and power consumption.

DETAILED DESCRIPTION OF THE INVENTION

Figure 2:
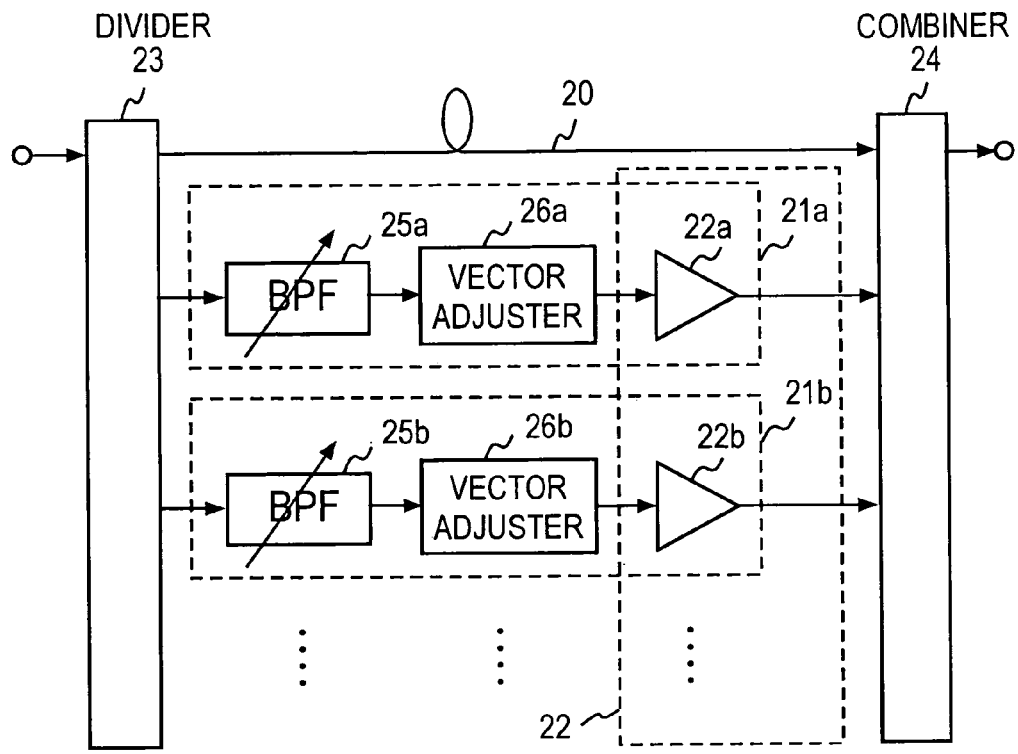
FIG. 2 is a diagram showing a configuration example of a multiple frequency band signal processing circuit used in the feed forward amplifier of the present invention.

In FIG. 2, there is shown the principle of the multiple frequency band signal processing circuit of a feed forward amplifier of the present invention. This multiple frequency band signal processing circuit includes a linear signal path 20 constituted by a delay line, respective variable frequency band vector adjustment paths 21a and 21b, multiple frequency band amplifying parts 22a and 22b amplifying the signals of the respective variable frequency band vector adjustment paths 21a and 21b, a dividing part 23 dividing input signals into the linear signal path and the respective variable frequency band vector adjustment paths, and a combining part 24 combining the output of multiple frequency band amplifying parts 22a and 22b and the output of linear signal path 20.

First variable frequency band vector adjustment path 21a includes a first variable frequency band extractor 25a extracting a first frequency band signal at a center frequency f1 and a vector adjuster 26a adjusting the amplitude and phase of the first frequency band signal. Second variable frequency band vector adjustment path 21b includes a second variable frequency band extractor 25b extracting a second frequency band signal at a center frequency f2 and a vector adjuster 26b adjusting the amplitude and phase of the second frequency band signal. The outputs of these vector adjusters 26a and 26b are amplified by multiple frequency band amplifying parts 22a and 22b.

Figure 1:
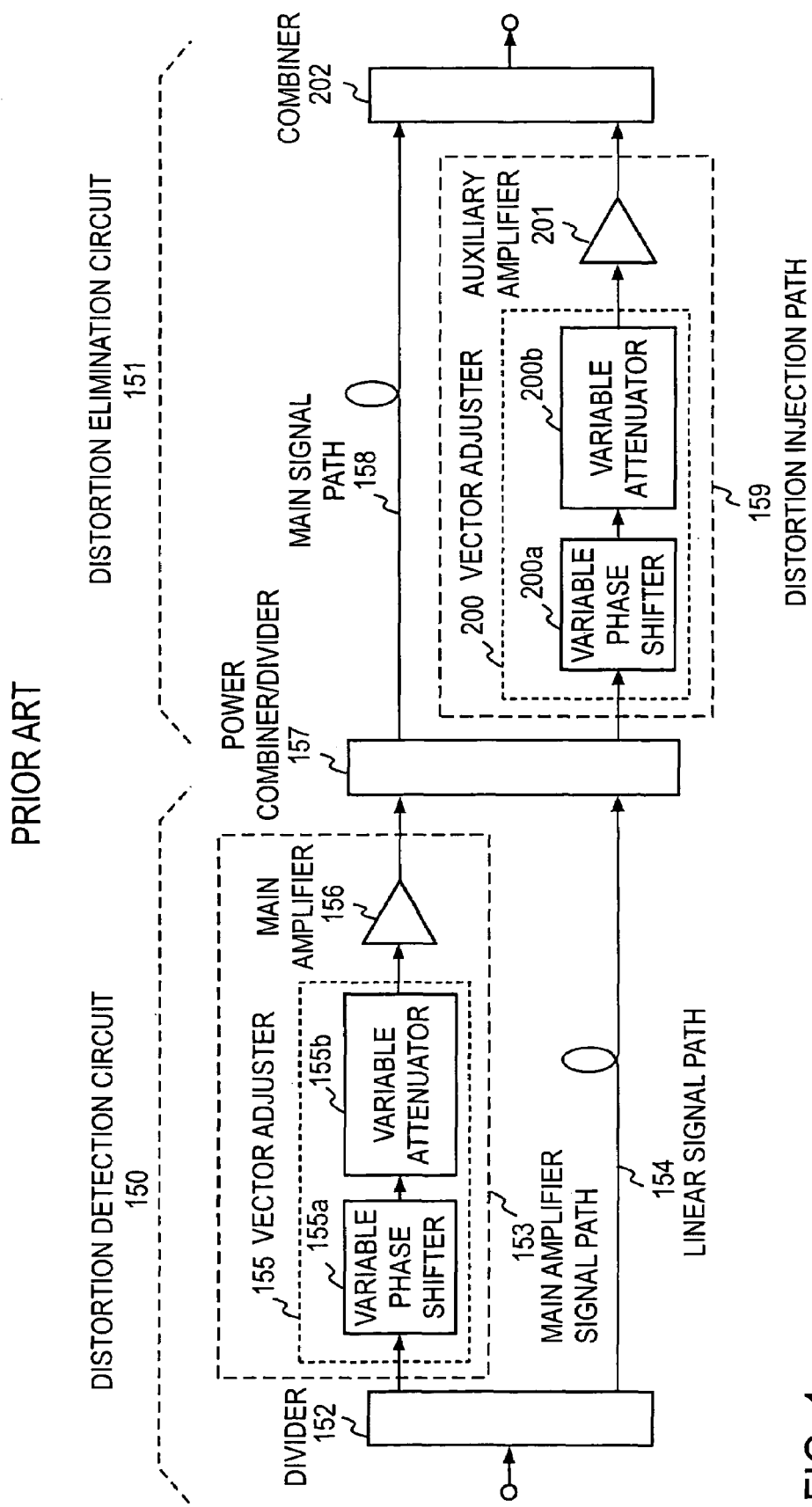
FIG. 1 is a diagram showing the basic configuration of a conventional feed forward amplifier.

In FIG. 2, it is indicated with dotted lines that yet other variable frequency band vector adjustment paths may be provided. Each of these vector adjusters is left not illustrated but, similarly to variable frequency band vector adjustment paths 21a and 21b, they are constituted by a series connection of a variable frequency band extractor, a vector adjuster, and a multiple frequency band amplifying part. Dividing part 23 divides the input signal into linear signal path 20 and first and second variable frequency band vector adjustment paths 21a, 21b, etc. Combining part 24 combines the outputs of the same paths. It is possible to configure the feed forward amplifier of this invention by applying the multiple frequency band signal processing circuit shown in FIG. 2 to distortion detection circuit 150 and distortion elimination circuit 151 of the feed forward amplifier explained in FIG. 1.

An explanation will be given for the case where e.g. frequency band f1 corresponds to the 800 MHz band, frequency band f2 corresponds to the 1.5 GHz and where further the 2 GHz band is used as frequency band f3 and the 5 GHz band is used as frequency band f4. These frequency bands are sufficiently separated from one another, compared to the bandwidth of each frequency band, so a variable frequency band extractor is provided for each respective frequency band. Variable frequency band extractors 25a, 25b, 25c, and 25d respectively extract the signals of each frequency band. Vector adjusters 26a, 26b, 26c, and 26d respectively adjust the vectors of the signals of each frequency band. Multiple frequency band amplifying parts 22a, 22b, 22c, and 22d respectively amplify the signals of each frequency band. Combining part 24 combines the outputs from multiple frequency band amplifying parts 22a, 22b, 22c, and 22d and the output of linear signal path 20.

Figure 3:
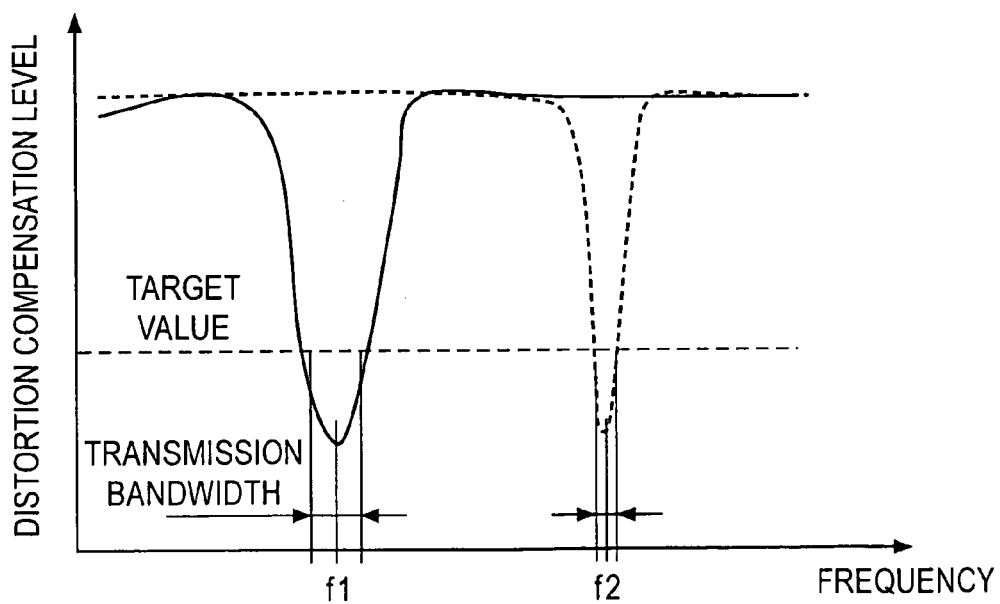
FIG. 3 is a diagram showing a conceptual diagram of distortion compensation in the case of configuring a variable frequency band extractor with a variable band pass filter.

In FIG. 3, there is shown conceptually the distortion compensation in the case where the first and second variable frequency band extractors are constituted by variable band pass filters. The frequency bands respectively having center frequencies of f1 and f2 are respectively sufficiently separated, making distortion compensation possible in the respective frequency bands.

First and second variable frequency band extractors 25a and 25b extract signals in the respective first frequency band and second frequency band so that the bands have desired bandwidths with respective center frequencies f1 and f2. Each variable frequency band extractor of this kind may e.g. be constituted by a variable band pass filter (BPF) or may be constituted by a variable band elimination filter (BEF).

Figure 4:
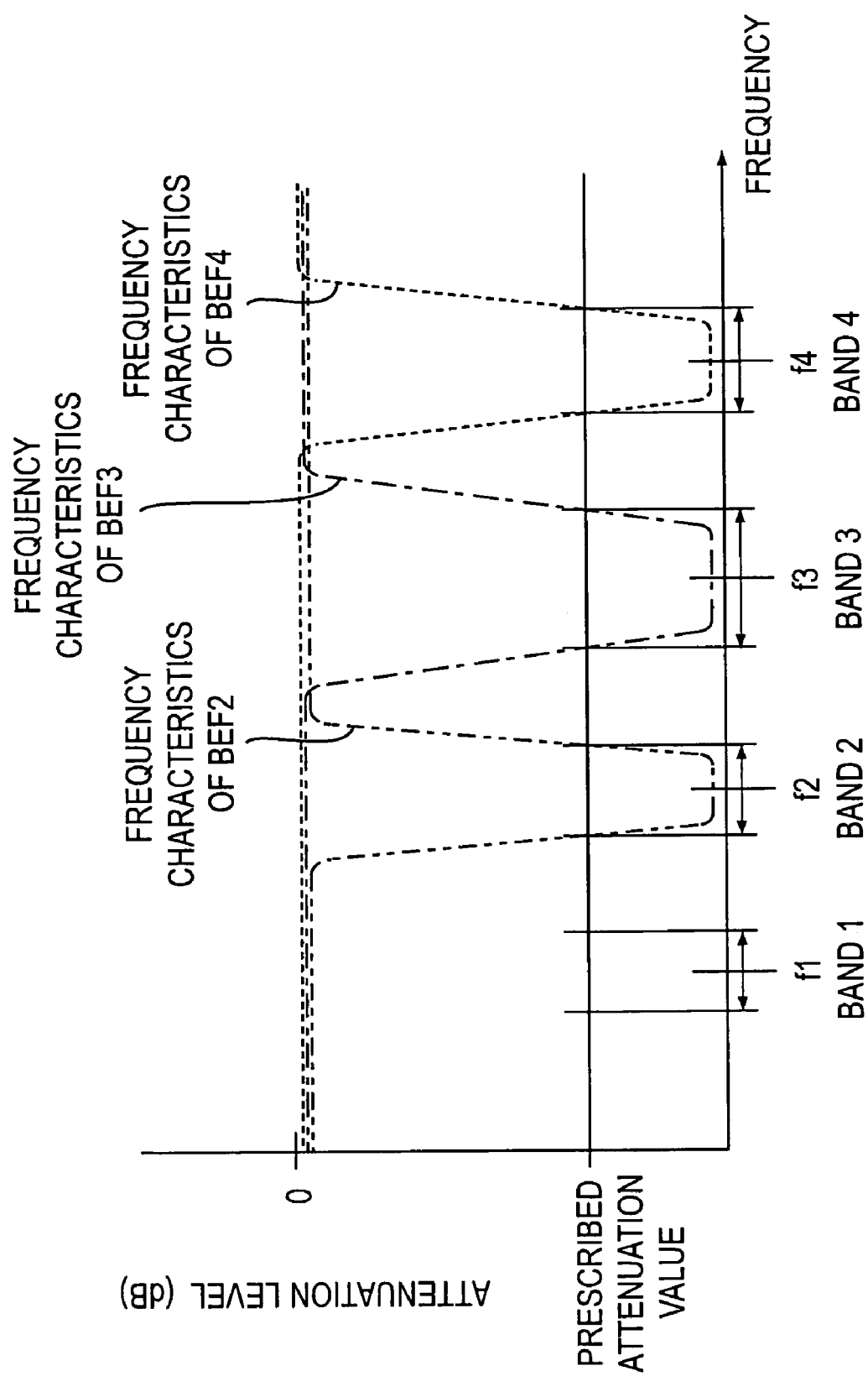
FIG. 4 is a diagram showing an example of the attenuation level in the case where the variable frequency band extractor is configured with a variable band elimination filter.
Figure 5:
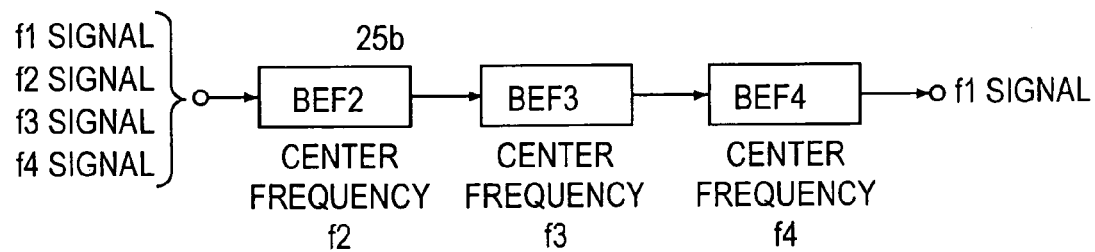
FIG. 5 is a diagram showing the cascade connection of a band elimination filter.

FIG. 4 shows an example of the frequency characteristics of the attenuation level in the case where the first variable frequency band extractor is constituted by a variable band elimination filter. This example conceptually shows the characteristics required of first variable frequency band extractor 25a in the case where frequency bands f3 and f4 are also added to the multiple frequency band signal processing circuit of FIG. 2. These characteristics can, as shown in FIG. 5, be formed with three band elimination filters BEF2, BEF3, and BEF4 eliminating the second, third, and fourth frequency bands, all the frequency bands except for the first frequency band. It is desirable for each band elimination filter to have sufficient elimination characteristics in the band thereof and to have sufficiently low-loss pass characteristics in the other bands. A band elimination filter of that kind can e.g. be constituted by a notch filter. When it comes to notch filters, there are band elimination filters using dielectric resonators and filters using stubs based on micro strip lines. In the same way, second variable frequency band extractor 25b can be formed with three band elimination filters eliminating the first, third, and fourth frequency bands. It is similar for the third and fourth frequency band extractors as well. In this way, the multiple frequency band signal processing circuit is not one in which the number of applicable frequency bands is limited to two, but in order to simplify the explanation below, the case where the number of frequency bands is 2 will be explained.

The advantage of configuring a frequency band extractor with a band pass filter is that it is easy to extract the band periphery of the center frequency and also that it is comparatively easy to obtain isolation from the center frequency. However, since the center frequency becomes the oscillation frequency of the band pass filter, the delay of the signal increases. Consequently, there is a need to extend the delay line constituting linear signal path 20 of FIG. 2 to match the delay quantity thereof, so there is the disadvantage that the attenuation level also increases. In the case that the frequency band extractor is configured with a band elimination filter, the extracted frequency band is not the center frequency of the band elimination filter. Consequently, the delay in the extracted frequency band is small. Accordingly, there are the advantages that the line length of linear signal path 20 becomes shorter and has lower loss. Further, the design of band elimination filters is also simple.

Figure 6:
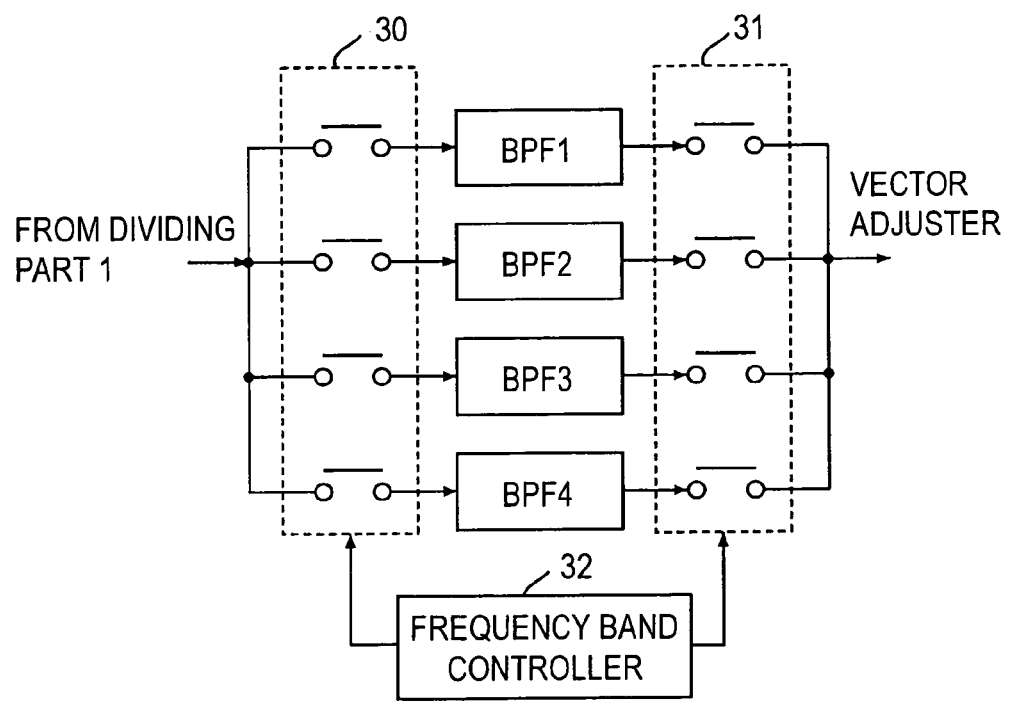
FIG. 6 is a diagram showing a configuration example of filtering based on four filters.
Figure 7:
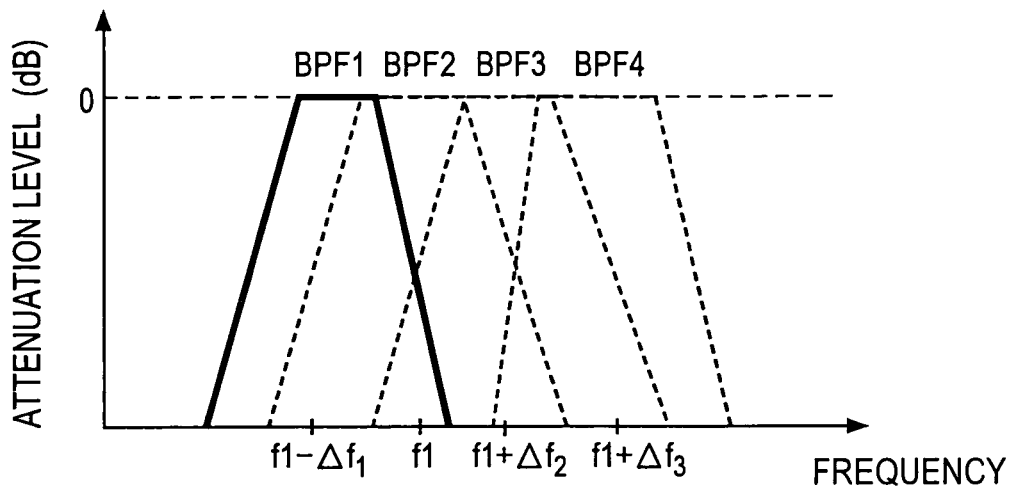
FIG. 7 is a diagram showing the frequency characteristics of the filtering.
Figure 8:
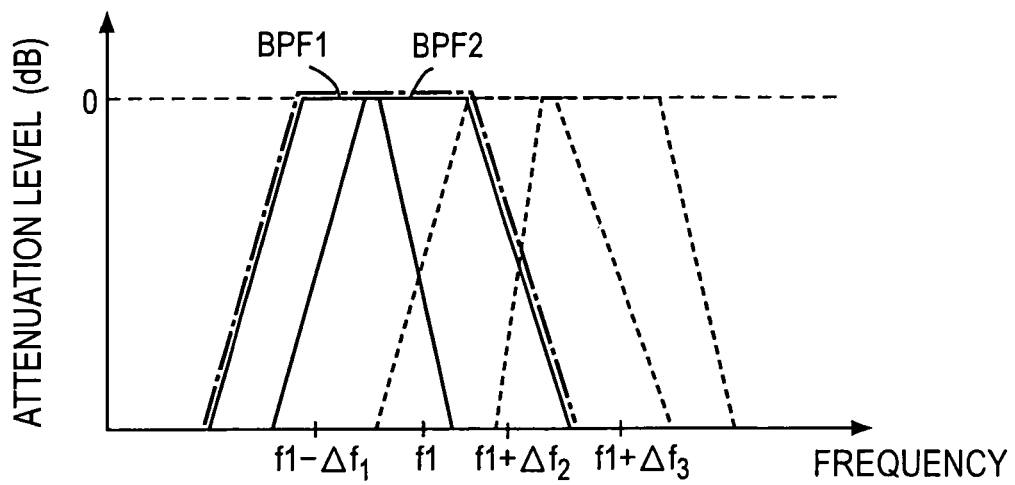
FIG. 8 is a diagram showing the frequency characteristics of the filtering.

As for variable band pass filters and variable band elimination filters, it is possible to change the center frequency or the bandwidth thereof. In the case of filters made with micro strip lines, there is the method of changing the resonator length by means of a diode, a MEMS (Microelectromechanical System) switch, or the like, to change the center frequency. As a method of varying the bandwidth of a band pass filter, there is the method of switching to a filter bank with a different number of center frequencies. In FIG. 6, an example of a filter bank having four filters is shown. A frequency band controller 32 controls the number of operated filters by turning on and off switches 30 and 31 located before and after the filters. In FIG. 7, the frequency characteristics of the filter bank in the cases that only filter BPF1 is operated are shown. In FIG. 8, the frequency characteristics of the filter bank in the case that filter BPF1 and filter BPF2 are operated are shown. Since BPF1 and BPF2 have adjacent frequency characteristics, the result is that the frequency characteristics of the filter bank are the combined frequency characteristics of BPF1 and BPF2. In this way, by using a filter bank, the pass bandwidth can be modified. As a method of varying the bandwidth of a band elimination filter, there is the method of switching, with a diode, a MEMS switch, or the like, a resonator based on micro strip lines.

The line length of linear signal path 20 is designed so that, on the input side of combining part 24, the signal delay quantity due to linear signal path 20 and the delay quantity due to variable frequency band vector adjustments paths 21a and 21b become equal. First vector adjuster 26a controls the phase and amplitude of the signal of first variable frequency band vector adjustment path 21a so that the first frequency band f1 component of the output signal of linear signal path 20 and the output of multiple frequency band amplifying part 22a have equal amplitude and opposite phase. In the same way, second vector adjuster 26b controls the phase and amplitude of the signal of second variable frequency band vector adjustment path 21b so that the second frequency band f2 component of the output signal of linear signal path 20 and the output of multiple frequency band amplifying part 22b have equal amplitude and opposite phase. By means of this adjustment, combining part 24 can output the differential component and the additive component of the output of linear signal path 20 and the outputs of variable frequency band vector adjustment paths 21a and 21b.

Vector adjusters 26a and 26b of first and second variable frequency band vector adjustment paths 21a and 21b of the multiple frequency band signal processing circuit of FIG. 2 are respectively adjusted taking linear signal path 20 as a reference. As a result of this, it is possible to perform vector adjustment independently with respect to frequency band f1 and frequency band f2.

Below, an explanation is given of a more specific example of a multiple frequency signal processing circuit. Further, in the explanation below, the parts given names ending by -er/-or can of course be constituted by physical circuits, but it is also possible to implement the same by means of arithmetic processors and software.

Figure 9:
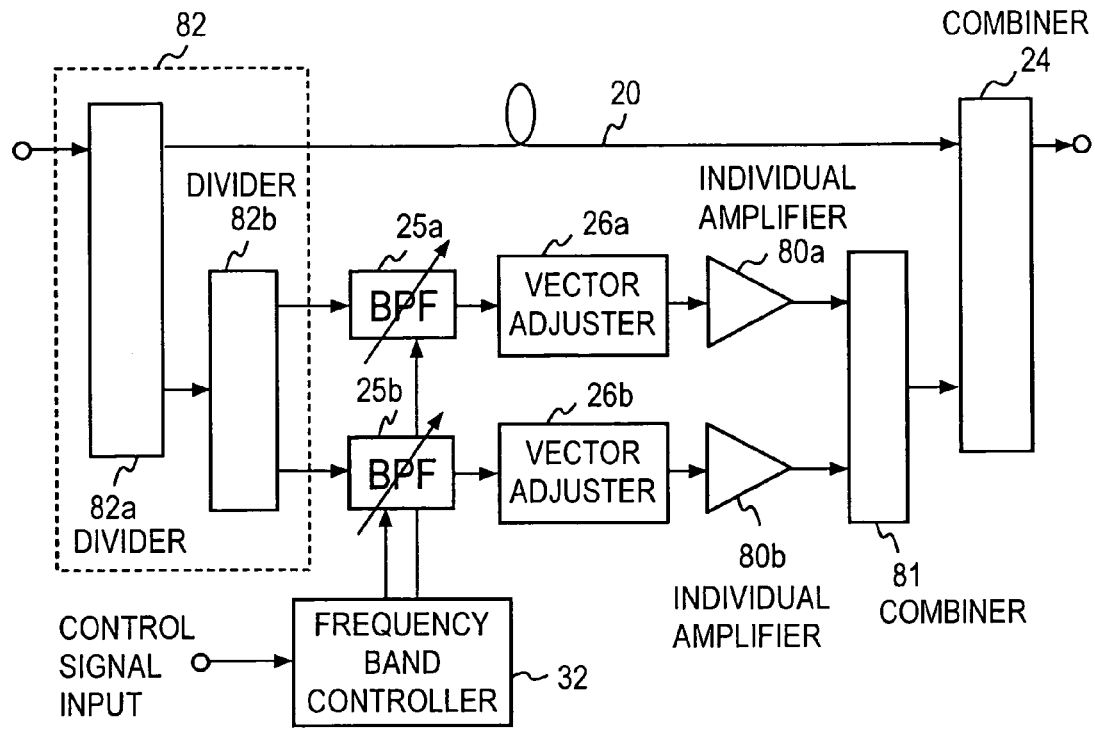
FIG. 9 is a diagram showing a concrete configuration example of a multiple frequency band processing circuit.

FIG. 9 is a specific first configuration example of the multiple frequency band signal processing circuit shown in FIG. 2. This first configuration example is composed of multiple frequency band amplifying part 22 of FIG. 2, individual amplifiers 80a and 80b for the respective frequency bands, and a combiner 81 combining the outputs of the same amplifiers and taking this to be the output of the multiple frequency band amplifying part. Also, a divider 82 is composed of a divider 82a and a divider 82b. Divider 82a divides the input signal into two, distributing one to linear signal path 20 and the other to divider 82b. Divider 82b further divides the signal distributed from divider 82a into signals for each variable frequency band vector adjustment circuit. The adjustment of the signal vector due to the vector adjustment path of each variable frequency band and the differential component and the additive component obtained thereby at the output terminal of combiner 24 are the same as in the case of FIG. 2, so an explanation thereof is omitted. As for combiner 24, a directional coupler, a Wilkinson power combiner, or the like, can be used. Frequency band controller 32 controls variable band pass filters 25a and 25b by a control signal from an operations center or a band detector.

Figure 10:
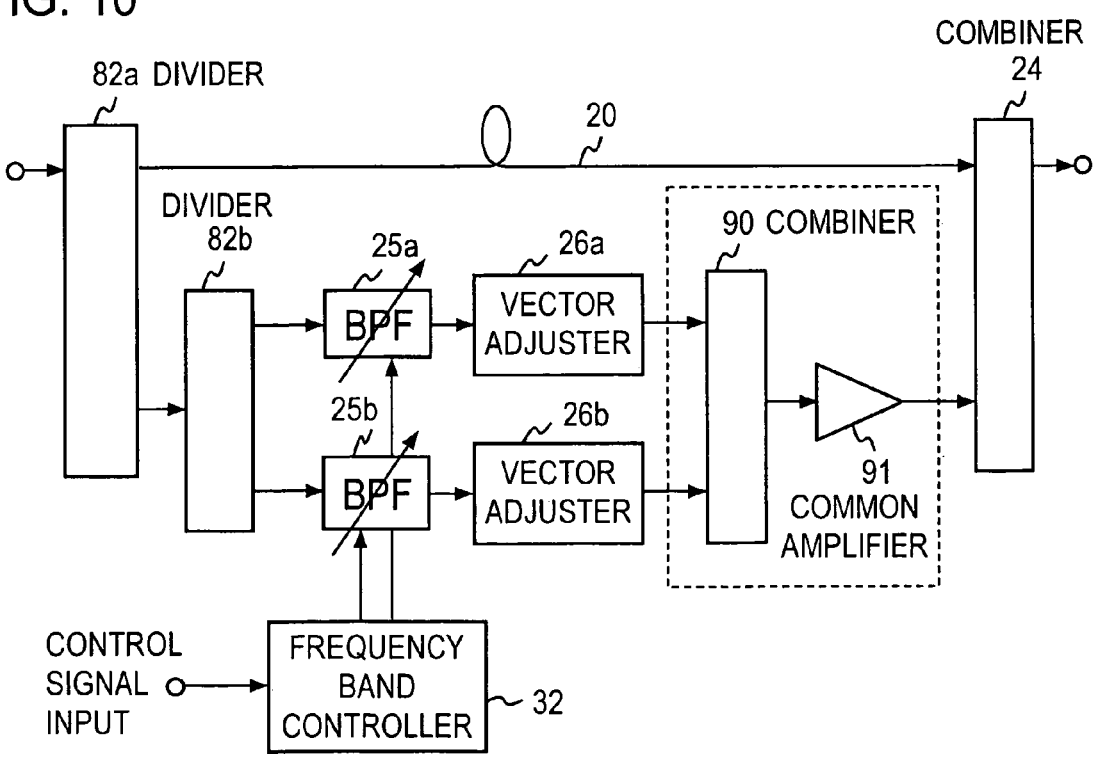
FIG. 10 is a diagram showing a second configuration example of a multiple frequency band processing circuit.

In FIG. 10, a second configuration example of a multiple band signal processing circuit is shown. The difference between FIG. 10 and FIG. 9 is that after the outputs of vector adjusters 26a and 26b have been combined with a combiner 90, the output is amplified with a common amplifier 91. The other parts are the same as the corresponding parts in FIG. 9, so an explanation thereof will be omitted.

In case the frequency is changed e.g. from frequency band f1 to frequency band f2, frequency band controller 32 changes the pass band of variable band pass filter 25a from f1 to f2 by a control signal from an operations center or a band detector. At this point, variable band pass filter 25a changes the center frequency by means of a change in the resonator structure. By proceeding in this way, it is possible to adaptively change a once set operating band of the power amplifier. In other words, the configuration of the power amplifier of the present invention makes unnecessary new equipment investment accompanying a change in the frequency band.

A base station handling a plurality of radio systems is provided with transmitters and receivers handling a plurality of radio systems. A plurality of transmitter output signals are power amplified by means of the multiband feed forward amplifier of the present invention. In the case that, within the area in which the base station is offering mobile communication services, cell interference increases because the number of subscribers increases or for some other reason, the operations center monitoring the concerned base station carries out an instruction to the concerned base station to change some of the radio systems.

Also, accompanying an increase or a reduction in the number of carrier waves used in frequency band f1, frequency band controller 32 increases or reduces the pass bandwidth of variable band pass filters 25a, 25b based on a control signal from the operations center or the band detector. An increase/reduction of the pass bandwidth like this can be implemented, as shown in FIG. 6, by changing the number of filters in the filter banks of variable band pass filters 25a and 25b. In this way, it becomes possible, even in the case of carrying out an increase or reduction in the number of carrier waves in response to fluctuations in the communication traffic, to suppress to a minimum cell interference occurring due to the increase in the number of carrier waves.

1. FIRST EMBODIMENT

Figure 11:
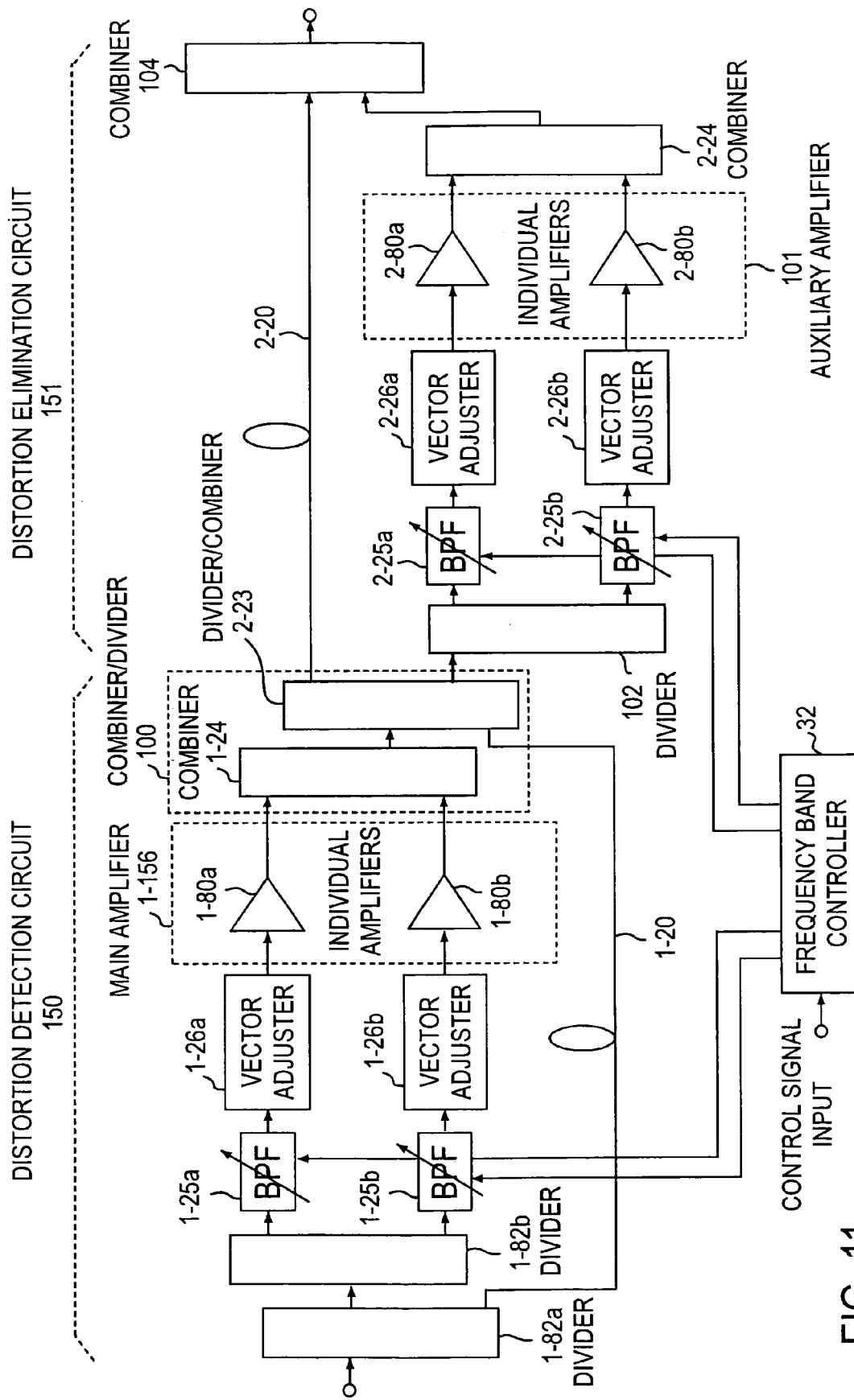
FIG. 11 is a diagram showing the first embodiment of a feed forward amplifier in accordance with the present invention.

In FIG. 11, Embodiment 1 of a feed forward amplifier according to the present invention is shown. In order to simplify the drawings and explanations for all the embodiments below, the explanation will be given taking the number of used frequency bands to be 2, but in general, two or more frequency bands may be used.

In the explanation below, "1-" is attached in front of reference numerals of the multiple frequency band signal processing circuit forming the distortion detection circuit and "2-" is attached in front of reference numerals of the multiple frequency band signal processing circuit forming the distortion elimination circuit. However, in the case of intrinsic numerals, the notation is not used.

A combiner 1-24 of the multiple frequency band signal processing circuit constituting distortion detection circuit 150 functions as a combiner/divider 100, together with a divider 2-23 of the multiple frequency band signal processing circuit constituting distortion elimination circuit 151. Also, a multiple frequency band amplifying part composed of individual amplifiers 1-80a and 1-80b of distortion detection circuit 150 constitutes a main amplifier 1-156 in the feed forward amplifier. Each individual amplifier 1-80a and 1-80b is a power amplifier. The multiple frequency band amplifying part of distortion elimination circuit 151 constitutes an auxiliary amplifier 101 of the feed forward amplifier. Individual amplifiers 2-80a and 2-80b are linear amplifiers.

Combiner/divider 100 obtains, at an output terminal thereof, the differential component of the output of linear signal path 1-20 and the combined output of vector adjustment paths 1-21 and outputs it to a divider 102 of distortion elimination circuit 151. Also, combiner/divider 100 obtains the additive component of the output of linear signal path 1-20 and the output of combiner 1-24 and outputs the same to linear signal path 2-20 of distortion elimination circuit 151. Since main amplifier 1-156, which is composed of individual amplifiers 1-80a and 1-80b, generates intermodulation distortion when amplifying the signal, the differential component output by combiner/divider 100 to the divider 102 side works out to the distortion component occurring due to individual amplifiers 1-80a and 1-80b. Moreover, as for the additive component output by combiner/divider 100 to linear signal path 2-20 (main signal path) side, the multiple frequency band input signal and the combined signal of the output signals of the individual amplifiers are output.

A combiner 104 of distortion elimination circuit 151 outputs the output of linear signal path 2-20 and the differential component of the combined output of the respective frequency band vector adjustment paths. Consequently, the distortion component generated by the main amplifier and included in the output of the linear signal path is cancelled by the combined output of vector adjustment paths 2-26a and 2-26b, so the signal component of the multiple frequency bands is output to the terminal.

In order to implement a distortion elimination quantity with a distortion elimination circuit 151 like this, distortion detection circuit 150 and distortion elimination circuit 151 may perform vector adjustment based on the multiple frequency band signal processing circuit explained in FIG. 2.

The feed forward amplifier of Embodiment 1 uses a vector adjuster for each frequency band. Consequently, it is possible to carry out distortion compensation independently for each frequency band. The vector adjusters adjust the amplitude and phase of the signals passing through each vector adjuster so that the signals have the same amplitude, opposite phase, and same delay with respect to the delay lines of distortion detection circuit 150 and distortion elimination circuit 151.

The distortion compensation level in the case of amplifying two frequency band signals by means of the feed forward amplifier of FIG. 11 has the characteristics shown in FIG. 3. In the feed forward amplifier of this invention, the main amplifier distortion components included in the amplified signals of each frequency band with respective center frequencies f1 and f2 adjust, for each frequency band, the vector adjusters of distortion detection circuit 150 and distortion elimination circuit 151 so as to respectively be at or below a prescribed value (target value). If the isolation of each vector adjustment circuit is provided sufficiently, no influence is exerted, even if the vector adjuster of one frequency band is adjusted, on the vector adjuster of the other frequency band. In other words, it is possible to independently adjust the vector adjusters of a plurality of frequency bands. Also, by the addition of vector adjustment paths, it is possible to flexibly add frequency bands which are distortion compensated by the feed forward amplifier.

Among the first variable frequency band extracting means 1-25a and 2-25a and the second variable frequency band extracting means 1-25b and 2-25b, of the feed forward amplifier shown in Embodiment 1, it is acceptable to take any one to be a variable frequency extracting means, the others being frequency extracting means not changing the frequency.

First and second variable frequency band extracting means 1-25a, 1-25b, 2-25a, and 2-25b change the center frequency or the pass bandwidth by means of instructions of frequency band controller 32. Frequency controller 32, by a signal from an operations center, changes the center frequency or the bandwidth of the frequency band amplified in the feed forward amplifier. These control periods or control speeds differ depending on the respective radio system. Since the initial retraction operation related to the distortion compensation of the feed forward amplifier has a high speed, it is possible to change the settings of the first and second variable frequency band extracting means if the control period or the control speed is at least equal to or greater than the initial retraction operation time.

2. SECOND EMBODIMENT

Figure 12:
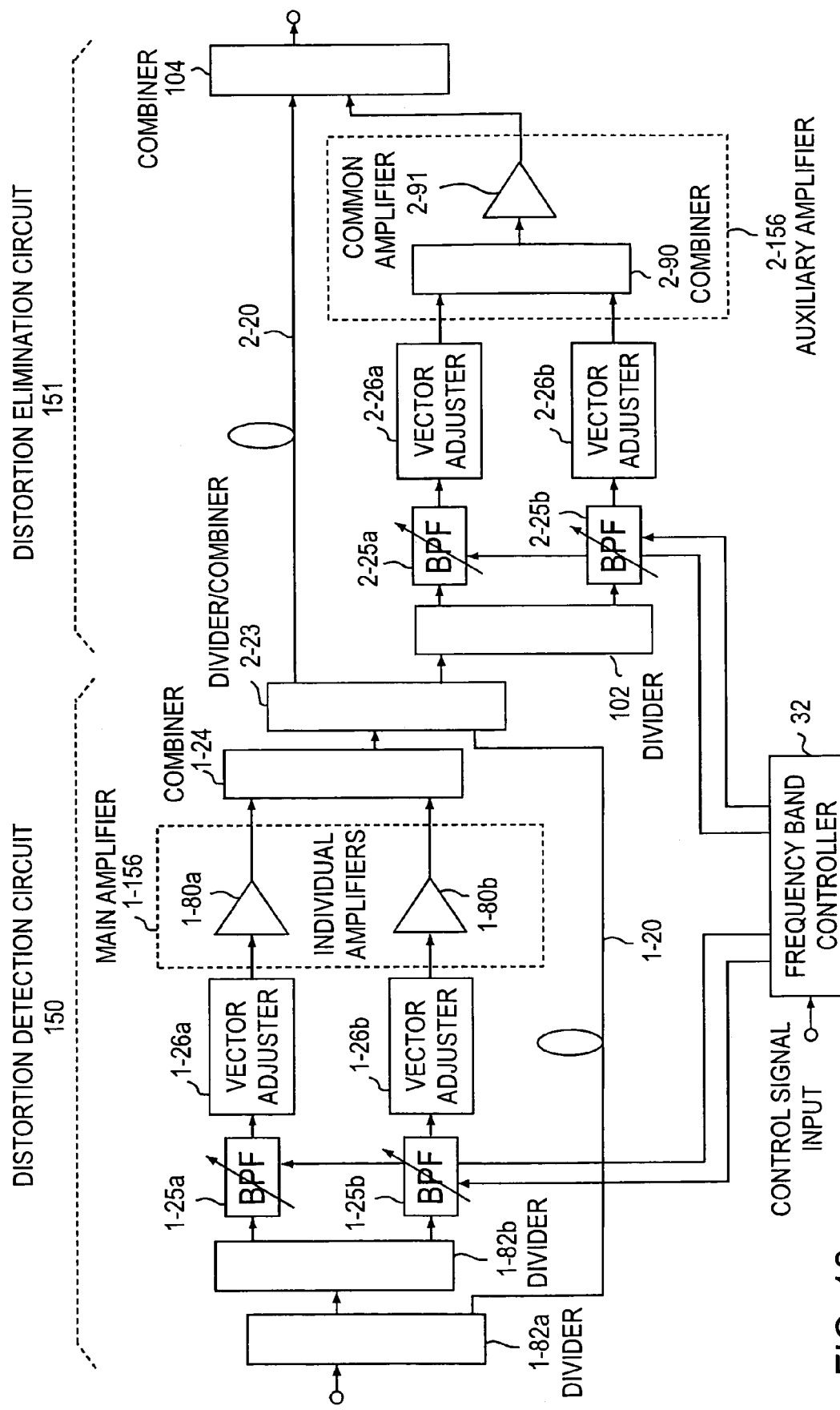
FIG. 12 is a diagram showing the second embodiment of a feed forward amplifier in accordance with the present invention.

In FIG. 12, Embodiment 2 is shown. Embodiment 2 is an embodiment in which the multiple frequency band signal processing circuit shown in FIG. 10 has been applied as distortion elimination circuit 151. In the Embodiment 2 feed forward amplifier as well, vector adjustment is performed using vector adjusters 1-26a, 1-26b, 2-26a, and 2-26b for each frequency band. If sufficient isolation is provided between the vector adjustment paths, there is no influence exerted on the vector adjusters of the other frequency bands, even if the vector adjuster of one frequency band is adjusted. Consequently, it is possible to carry out distortion compensation independently for each frequency band. Also, if vector adjustment paths are added, it is possible to flexibly add frequency bands which are distortion compensated.

An auxiliary amplifier 2-156 of the distortion elimination circuit has one common amplifier 2-91 which simultaneously amplifies a plurality of frequency bands, as shown in FIG. 10. Consequently, there can be expected a simplification and a reduction in power consumption of the device configuration, based on a reduction in the used number of parts in the amplifier.

3. THIRD EMBODIMENT

Figure 13:
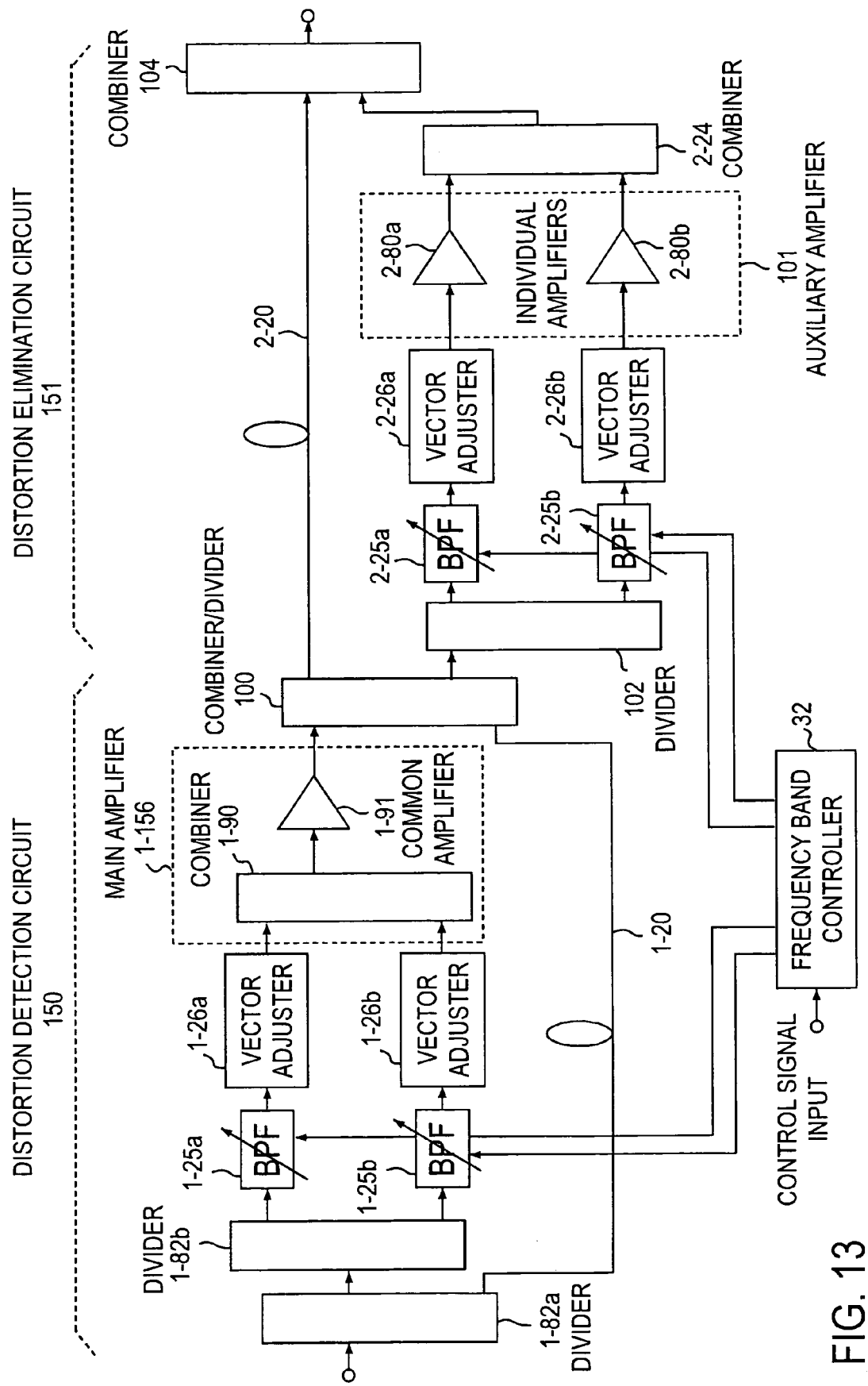
FIG. 13 is a diagram showing the third embodiment of a feed forward amplifier in accordance with the present invention.

In FIG. 13, Embodiment 3 is shown. Embodiment 3 is an example using the multiple frequency band signal processing circuit shown in FIG. 10 as distortion detection circuit 150. The feed forward amplifier of Embodiment 3 also carries out vector adjustment by using, for each frequency band, vector adjusters 1-26a, 1-26b, 2-26a, and 2-26b. If sufficient isolation is provided between the vector adjustment paths, there is no influence exerted on the other vector adjusters, even if the vector adjuster of one frequency band is adjusted. Consequently, it is possible to perform distortion compensation independently for each frequency band. Also, if vector adjustment paths are added, it is possible to flexibly add frequency bands which are distortion compensated.

Main amplifier 1-156 of distortion detection circuit has one common amplifier 1-91 which simultaneously amplifies a plurality of frequency bands, as shown in FIG. 10. Consequently, there can be expected a simplification and a reduction in power consumption of the device configuration, based on a reduction in the used number of parts in the amplifier.

4. FOURTH EMBODIMENT

Figure 14:
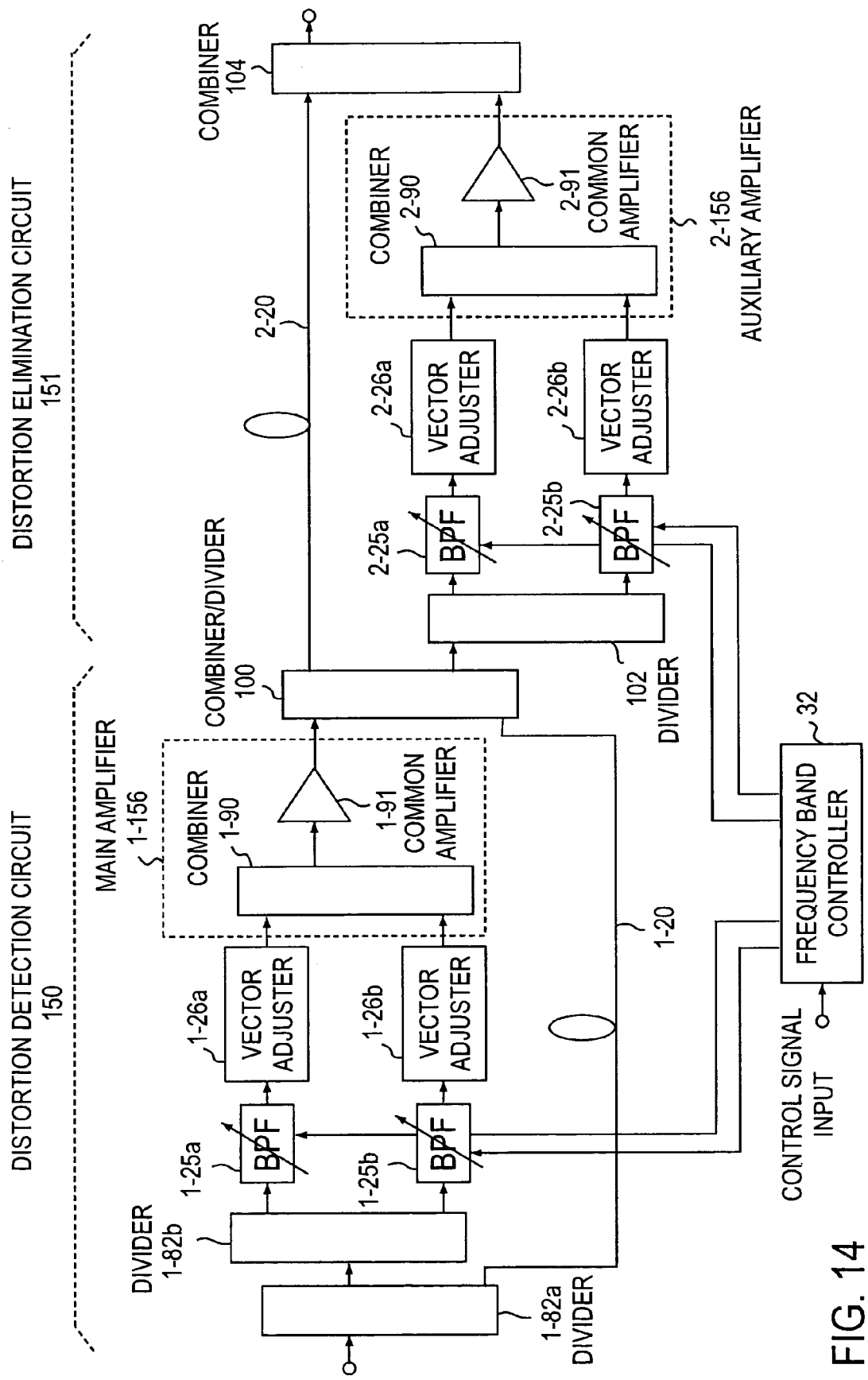
FIG. 14 is a diagram showing the fourth embodiment of a feed forward amplifier in accordance with the present invention.

In FIG. 14, Embodiment 4 is shown. Embodiment 4 is an embodiment where the multiple frequency band signal processing shown in FIG. 10 has been applied both to distortion detection circuit 150 and distortion elimination circuit 151. Main amplifier 1-156 of distortion detection circuit 150 is constituted by one common amplifier 1-91 which simultaneously amplifies a plurality of frequency bands, and auxiliary amplifier 2-156 of distortion elimination circuit 151 also has one common amplifier 2-91 which simultaneously amplifies a plurality of frequency bands. Consequently, there can be expected a simplification and a reduction in power consumption of the device configuration, based on a reduction in the used number of parts in the amplifier.

5. FIFTH EMBODIMENT

Figure 15:
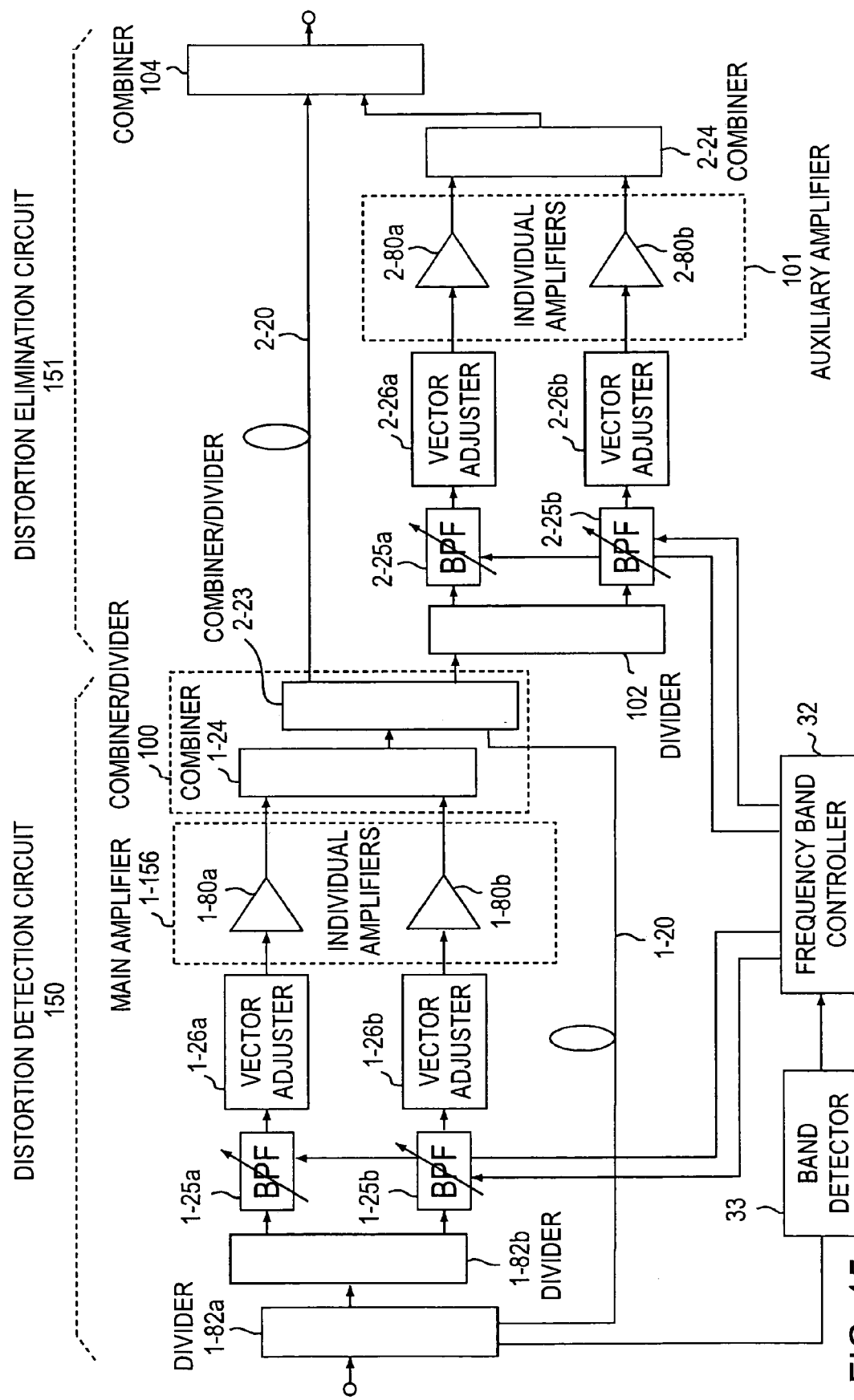
FIG. 15 is a diagram showing the fifth embodiment of a feed forward amplifier in accordance with the present invention.

In FIG. 15, Embodiment 5 is shown. Embodiment 5 is a configuration with a band detector 33 added to the configuration of FIG. 11. In the case of this configuration, a divider 1-82a distributes a portion of the input signal to band detector 33 as well. Band detector 33 detects the frequency band of the input signal by the method shown below and outputs a control signal to frequency band controller 32. The operation of the other constituent parts is the same as for Embodiment 1.

Figure 16:
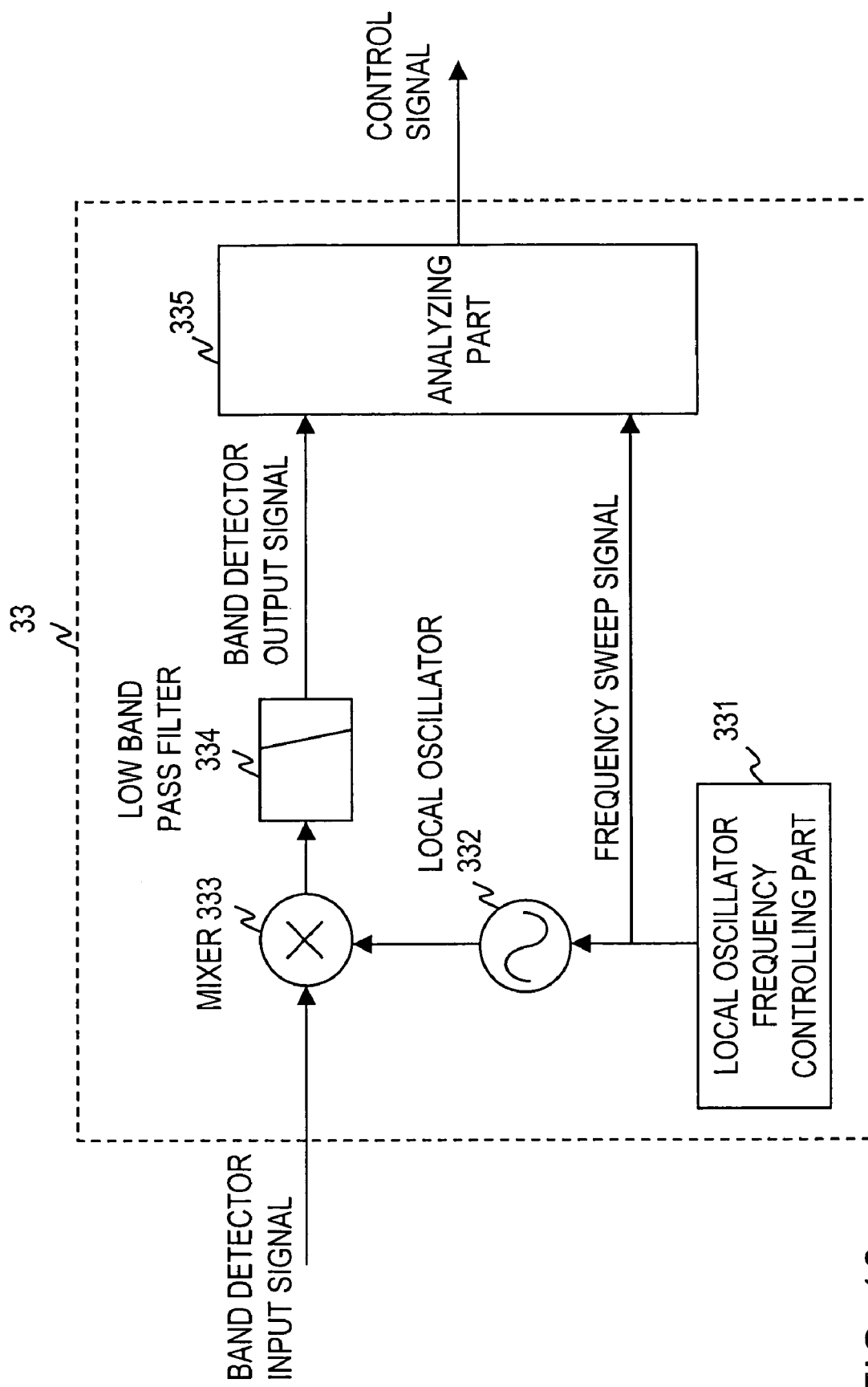
FIG. 16 is a diagram showing a functional configuration example of a band detector.

In FIG. 16, there is shown a functional configuration example of band detector 33. Band detector 33 is composed of a local oscillator frequency controlling part 331, a local oscillator 332, a mixer 333, a low band pass filter 334, and an analyzing part 335. Local oscillator frequency controlling part 331 controls local oscillator 332 so as to continuously sweep the frequency from the lower-limit frequency of the input signal to the upper-limit frequency. Following an instruction of local oscillator frequency controlling part 331, local oscillator 332 oscillates. Mixer 333 multiplies the input signal distributed from divider 1-82a and the signal from local oscillator 332. The output signal from mixer 333 includes the frequency component of the difference of the frequency of the input signal and the frequency of the signal from local oscillator 332. In other words, in the case that the frequency of the input signal and the frequency of the signal from local oscillator 332 are very close, the near-DC component (the low-frequency component) is included in the output from mixer 333. Low band pass filter 334 only lets through the low-frequency component of the output from mixer 333. Consequently, only in the case that the frequency of the input signal and the frequency of the signal from local oscillator 332 are very close is the band detector output signal obtained from low band pass filter 334. Analyzing part 335 compares the frequency sweep signal from local oscillator frequency controlling part 331 with the band detector output signal from low band pass filter 334, detects the frequency band of the input signal, and outputs the control signal to frequency band controller 32.

Figure 17:
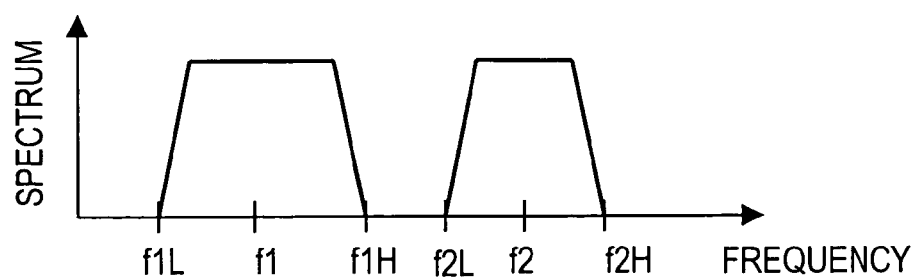
FIG. 17 is a diagram showing an example of the spectrum of the input signal of a feed forward amplifier.
Figure 18:
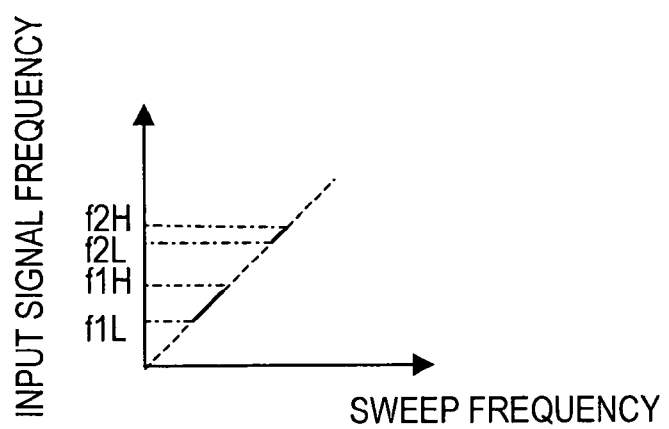
FIG. 18 is a diagram showing the relationship between the sweep frequency and the frequency of an input signal.
Figure 19:
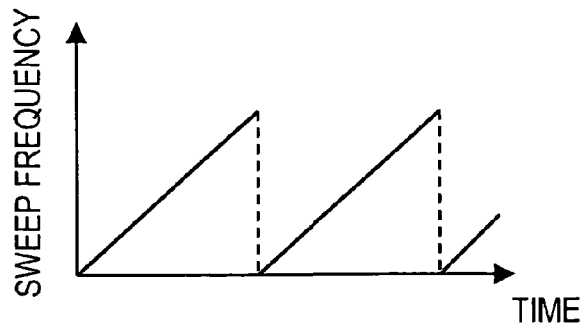
FIG. 19 is a diagram showing the time variation of a signal output from a local oscillator.
Figure 20:
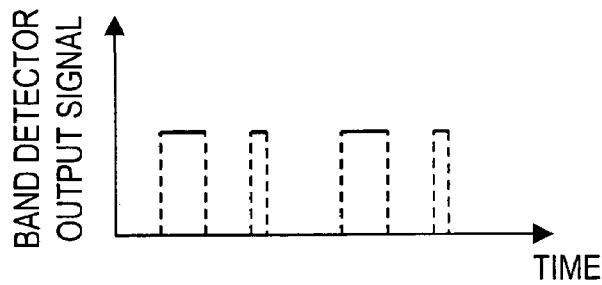
FIG. 20 is a diagram showing the time variation of a signal output from a low-pass filter.

In FIG. 17, there is shown an example of the input signal spectrum of a feed forward amplifier. The center frequency of the first frequency band is taken to be f1, the lower-limit frequency is taken to be f1L, and the upper-limit frequency is taken to be f1H. The center frequency of the second frequency band is taken to be f2, the lower-limit frequency is taken to be f2L, and the upper-limit frequency is taken to be f2H. In FIG. 18, the relationship between the sweep frequency and the input signal frequency is shown. The abscissa axis represents the sweep frequency and the ordinate axis represents the input signal frequency. This diagram shows that, in the case that the sweep frequency lies between frequency f1L and f1H, or between f2L and f2H, a near-DC signal from low band pass filter 334 is output. In FIG. 19, there is shown the time variation of the signal output from local oscillator 332. The abscissa axis represents time and the ordinate axis represents the output from local oscillator 332. In FIG. 20, there is shown the time variation of the output from low band pass filter 334. The abscissa axis represents time and the ordinate axis represents the power from low band pass filter 334. As shown in FIG. 20, in case the frequency of the output from local oscillator 332 corresponds to a range from frequency f1L to frequency f1H, or a range from frequency f2L to frequency f2H, the output from low band pass filter 334 is obtained.

Figure 21:
FIG. 21 is a diagram showing that the bandwidth of a detected frequency band becomes narrower in the case where a threshold value is set in the output of the low-pass filter.

Further, if a threshold value is set for the output from low band pass filter 334, the bandwidth of the frequency band becomes narrower, as shown in FIG. 21. Consequently, by multiplying, in analyzing part 335, the obtained lower-limit frequencies f1L and f2L and the upper-limit frequencies f1H and f2H by predetermined coefficients, each frequency may be corrected.

Also, local oscillator frequency controlling part 331 and analyzing part 335 can be implemented with an analog/digital converter and a microprocessor. As for local oscillator 332, generally used signal oscillators and the like may be used. Mixer 333 and low band pass filter 334 can be implemented with active filters using LC filters or operational amplifiers.

Since band detector 33 operates like this even in the case where the input signal is changed dynamically, the feed forward amplifier can respond adaptively. The time required to change the frequency band processed by the feed forward amplifier depends on the period of the signal swept by local oscillator 332. In case a high-speed frequency change is required, the period of the signal swept by local oscillator 332 may be shortened.

6. SIXTH EMBODIMENT

Figure 22:
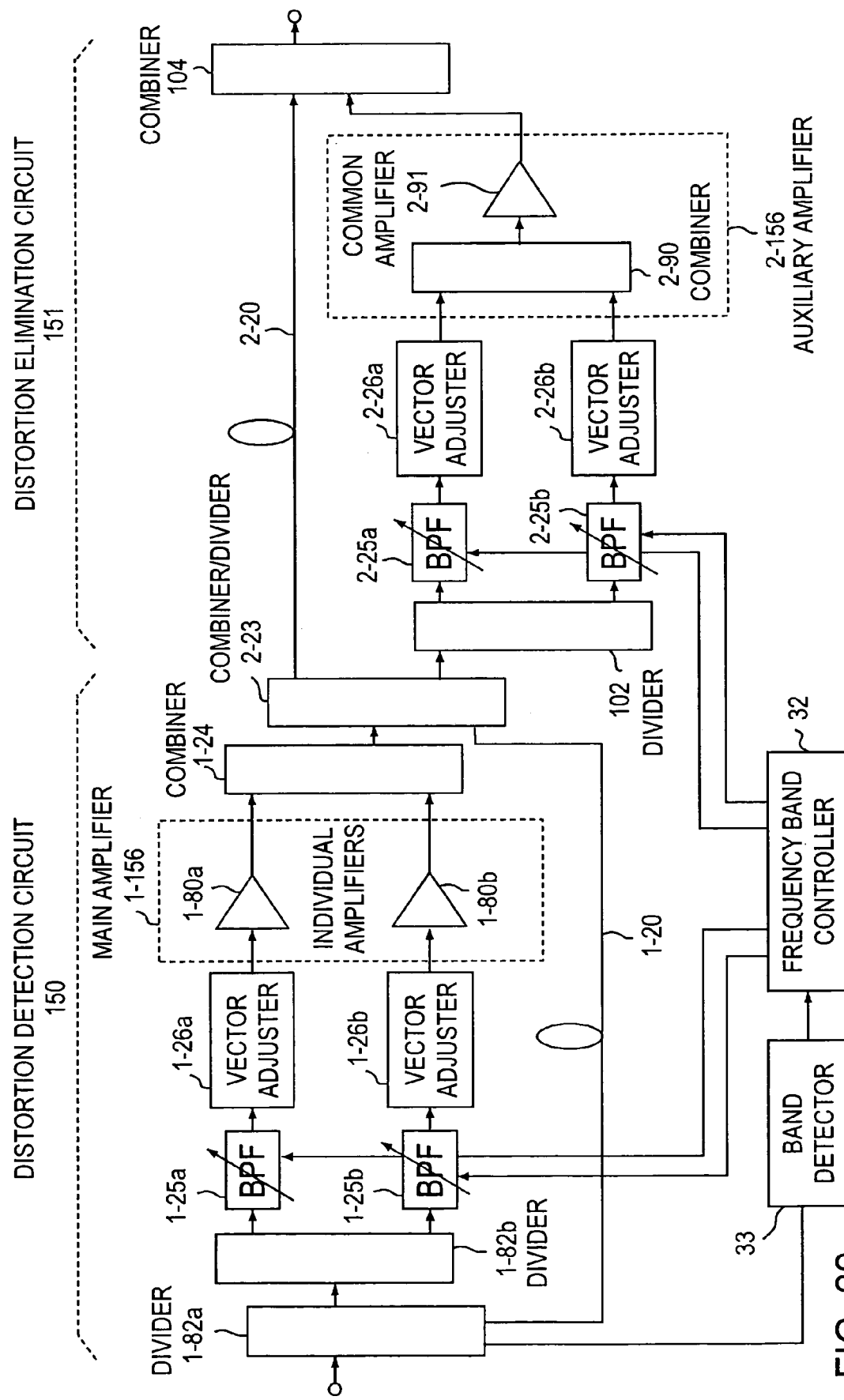
FIG. 22 is a diagram showing the sixth embodiment of a feed forward amplifier in accordance with the present invention.

In FIG. 22, Embodiment 6 is shown. Embodiment 6 is a configuration in which band detector 33 has been added to the configuration of FIG. 12. The configuration and operation of band detector 33 are the same as in Embodiment 5, and otherwise, the embodiment is the same as Embodiment 2.

7. SEVENTH EMBODIMENT

Figure 23:
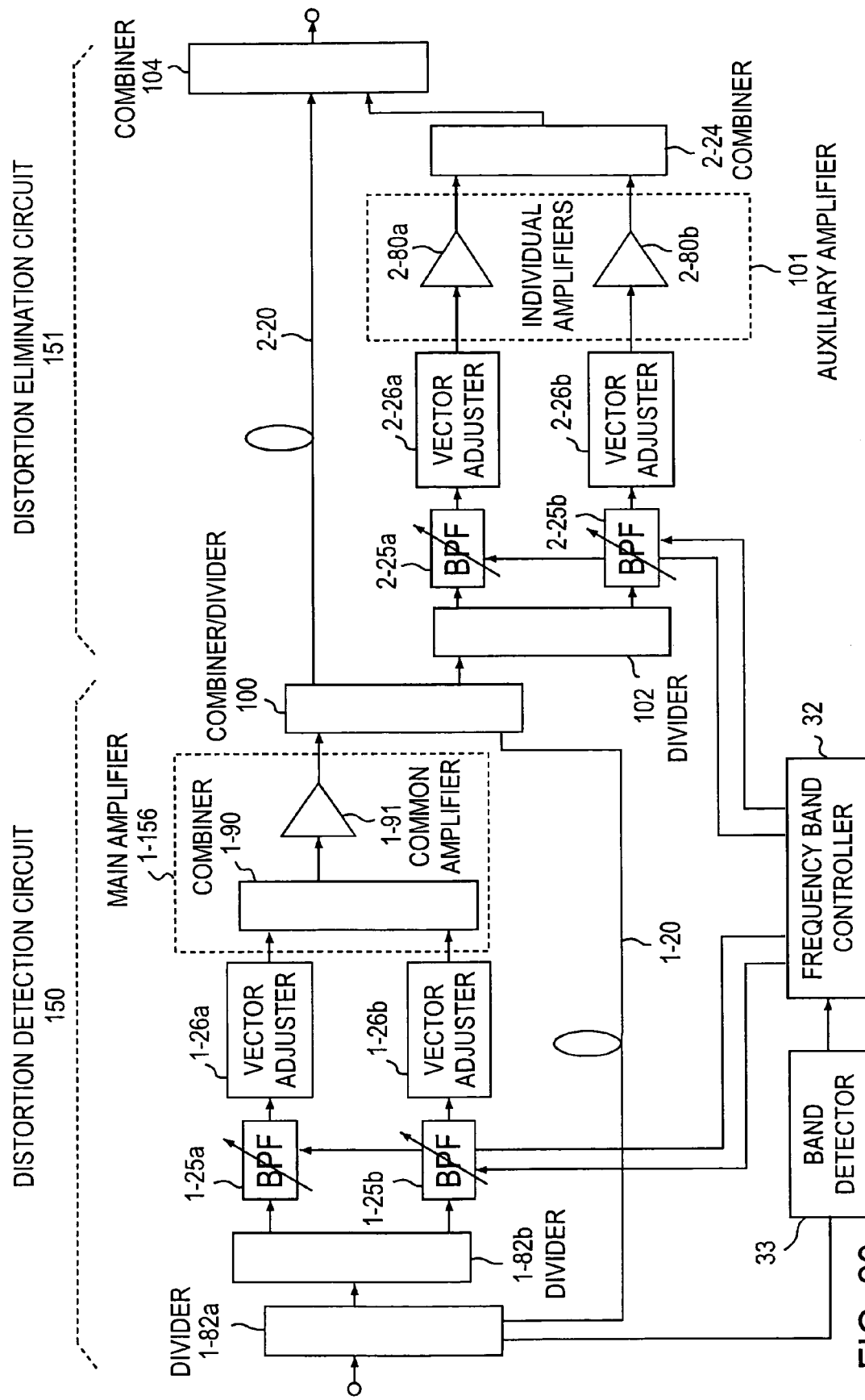
FIG. 23 is a diagram showing the seventh embodiment of a feed forward amplifier in accordance with the present invention.

In FIG. 23, Embodiment 7 is shown. Embodiment 7 is a configuration in which band detector 33 has been added to the configuration of FIG. 13. The configuration and operation of band detector 33 are the same as in Embodiment 5, and otherwise, the embodiment is the same as Embodiment 3.

8. EIGHTH EMBODIMENT

Figure 24:
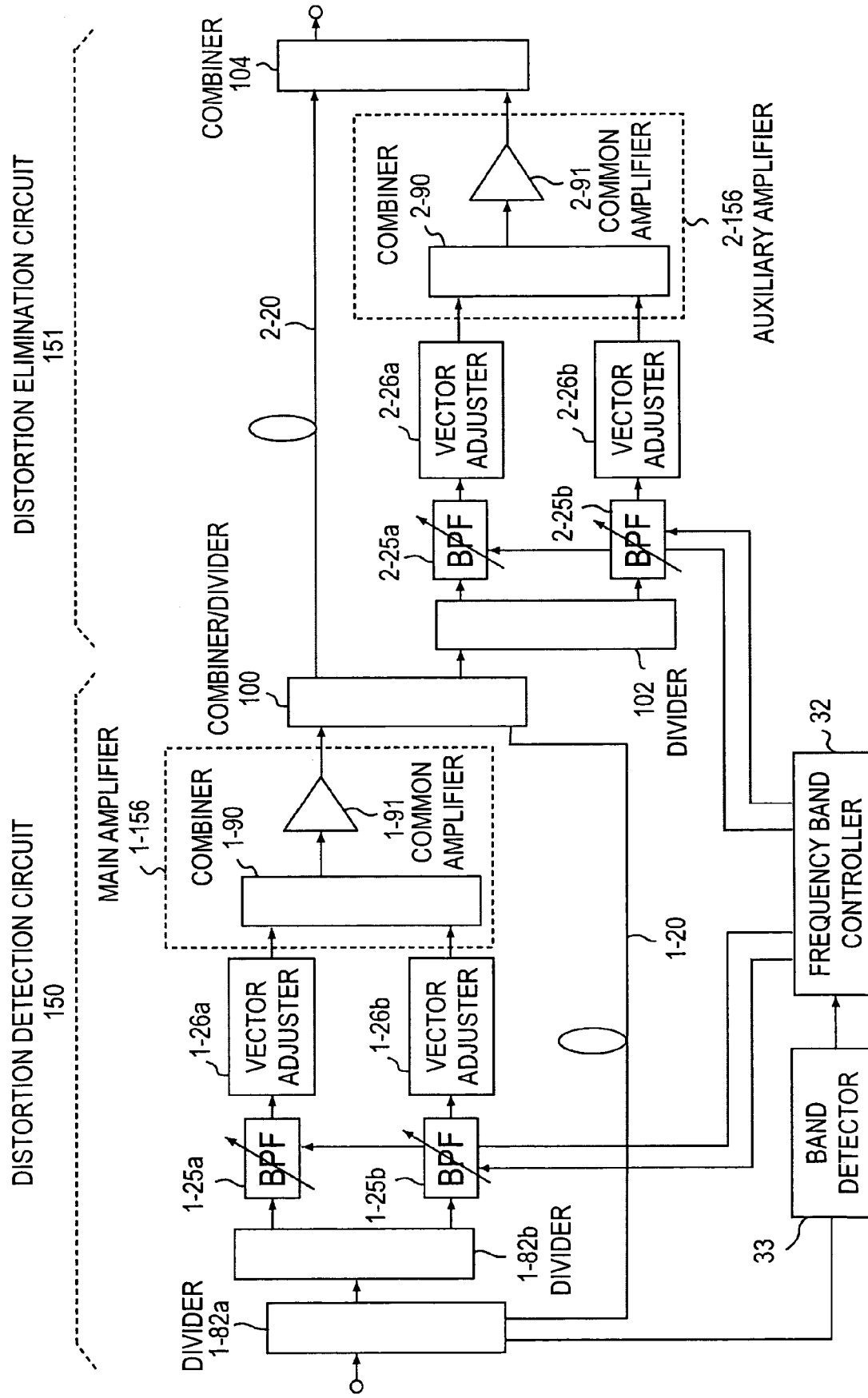
FIG. 24 is a diagram showing the eighth embodiment of a feed forward amplifier in accordance with the present invention.

In FIG. 24, Embodiment 8 is shown. Embodiment 8 is a configuration in which band detector 33 has been added to the configuration of FIG. 14. The configuration and operation of band detector 33 are the same as in Embodiment 5, and otherwise, the embodiment is the same as Embodiment 4.

INDUSTRIAL APPLICABILITY

The feed forward amplifier for multiple frequency bands using a multiple frequency band signal processing circuit of this invention can be utilized in a power amplifier for mobile communications transmitting signals in a plurality of frequency bands.

What is claimed is:

1. A feed forward amplifier for multiple frequency bands, having a distortion detection circuit and a distortion elimination circuit,
   wherein
   said distortion detection circuit comprises:
   a first linear signal path constituted by a first delay means;
   N first vector adjustment paths;
   a first dividing part dividing an input signal into said first linear signal path and said N first vector adjustment paths;
   N first variable frequency band extractors provided respectively for each said first vector adjustment path, and extracting signals of mutually discrete frequency bands;
   N first vector adjusters provided respectively for each said first vector adjustment path, and adjusting the phase and the amplitude thereof;

a first multiple frequency band amplifying part amplifying the output of each first vector adjuster of said first vector adjustment paths; and a combiner/divider outputting the additive component and the differential component of the output of said first linear signal path and the output of said first multiple frequency band amplifying part;

wherein said distortion elimination circuit comprises:

a second linear signal path, constituted by a second delay means, into which said additive component is input;

N second vector adjustment paths into which said differential component is input;

N second variable frequency band extractors, respectively provided for each said second vector adjustment path, extracting the signals of respectively the same frequency bands as said N first variable frequency band extractors;

N second vector adjusters, respectively provided for each said second vector adjustment path, and adjusting the phase and the amplitude thereof;

a second multiple frequency band amplifying part amplifying the outputs of the second vector adjusters of said second vector adjustment paths; and a second combining part combining and outputting the output of said second linear signal path and the output of said second multiple frequency band amplifying part;

N being an integer equal to or greater than 2;

and comprising:

a frequency band controller controlling said N first variable-frequency band extractors and said N second variable frequency band extractors.

2. The feed forward amplifier for multiple frequency bands according to claim 1, characterized in that:

said first multiple frequency band amplifying part includes N first amplifiers respectively amplifying individually the output of each first vector adjuster of said N first vector adjustment paths, and a first output combiner combining the outputs of said N first amplifiers and taking the combined output to be the output of said first multiple frequency band amplifying part; and said second multiple frequency band amplifying part includes N second amplifiers respectively amplifying individually the output of each second vector adjuster of said N second vector adjustment paths, and a second output combiner combining the outputs of said N second amplifiers and taking the combined output to be the output of said second multiple frequency band amplifying part.

3. The feed forward amplifier for multiple frequency bands according to claim 1, characterized in that:

said first multiple frequency band amplifying part includes a first output combiner combining the outputs of each first vector adjuster of said N first vector adjustment paths, and a common first amplifier amplifying the output of said first output combiner and taking the combined output to be the output of said first multiple frequency band amplifying part; and said second multiple frequency band amplifying part includes N second amplifiers respectively amplifying individually the output of each second vector adjuster of said N second vector adjustment paths, and a second output combiner combining the outputs of said N second amplifiers and taking the combined output to be the output of said second multiple frequency band amplifying part.

4. The feed forward amplifier for multiple frequency bands according to claim 1, characterized in that:

said first multiple frequency band amplifying part includes N first amplifiers respectively amplifying individually the output of each first vector adjuster of said N first vector adjustment paths, and a first output combiner combining the outputs of said N first amplifiers and taking the combined output to be the output of said first multiple frequency band amplifying part; and said second multiple frequency band amplifying part includes a second output combiner combining the outputs of each second vector adjuster of said N second vector adjustment paths, and a common second amplifier amplifying the output of said second output combiner and taking the combined output to be the output of said second multiple frequency band amplifying part.

5. The feed forward amplifier for multiple frequency bands according to claim 1, characterized in that:

said first multiple frequency band amplifying part includes a first output combiner combining the outputs of each first vector adjuster of said N first vector adjustment paths, and a common first amplifier amplifying the output of said first output combiner and taking the combined output to be the output of said first multiple frequency band amplifying part; and said second multiple frequency band amplifying part includes a second output combiner combining the outputs of each second vector adjuster of said N second vector adjustment paths, and a common second amplifier amplifying the output of said second output combiner and taking the combined output to be the output of said second multiple frequency band amplifying part.

6. The feed forward amplifier for multiple frequency bands according to claim 1, further comprising:

a band detector; and wherein said first dividing part distributes a portion of the input signal to said band detector as well; and wherein said band detector comprises a local oscillator;

a local oscillator frequency controlling part controlling the frequency of said local oscillator;

a mixer multiplying the input signal from said first dividing part and the signal from said local oscillator;

a low band pass filter letting through only the low-frequency component of the output of said mixer; and an analyzing part detecting the signal by which said local oscillator frequency controlling part controls the local oscillator, and the frequency band of said input signal from the output signal of said low band pass filter.

7. The feed forward amplifier for multiple frequency bands according to claim 2, further comprising:

a band detector; and wherein said first dividing part distributes a portion of the input signal to said band detector as well; and wherein said band detector comprises a local oscillator;

a local oscillator frequency controlling part controlling the frequency of said local oscillator;

a mixer multiplying the input signal from said first dividing part and the signal from said local oscillator;

a low band pass filter letting through only the low-frequency component of the output of said mixer; and an analyzing part detecting the signal by which said local oscillator frequency controlling part controls the local oscillator, and the frequency band of said input signal from the output signal of said low band pass filter.

8. The feed forward amplifier for multiple frequency bands according to claim 3, further comprising:

a band detector; and wherein said first dividing part distributes a portion of the input signal to said band detector as well; and wherein said band detector comprises a local oscillator;

a local oscillator frequency controlling part controlling the frequency of said local oscillator;

a mixer multiplying the input signal from said first dividing part and the signal from said local oscillator;

a low band pass filter letting through only the low-frequency component of the output of said mixer; and an analyzing part detecting the signal by which said local oscillator frequency controlling part controls the local oscillator, and the frequency band of said input signal from the output signal of said low band pass filter.

9. The feed forward amplifier for multiple frequency bands according to claim 4, further comprising:

a band detector; and wherein said first dividing part distributes a portion of the input signal to said band detector as well; and wherein said band detector comprises a local oscillator;

a local oscillator frequency controlling part controlling the frequency of said local oscillator;

a mixer multiplying the input signal from said first dividing part and the signal from said local oscillator;

a low band pass filter letting through only the low-frequency component of the output of said mixer; and an analyzing part detecting the signal by which said local oscillator frequency controlling part controls the local oscillator, and the frequency band of said input signal from the output signal of said low band pass filter.

10. The feed forward amplifier for multiple frequency bands according to claim 5, further comprising:

a band detector; and wherein said first dividing part distributes a portion of the input signal to said band detector as well; and wherein said band detector comprises a local oscillator;

a local oscillator frequency controlling part controlling the frequency of said local oscillator;

a mixer multiplying the input signal from said first dividing part and the signal from said local oscillator;

a low band pass filter letting through only the low-frequency component of the output of said mixer; and an analyzing part detecting the signal by which said local oscillator frequency controlling part controls the local oscillator, and the frequency band of said input signal from the output signal of said low band pass filter.

11. The feed forward amplifier for multiple frequency bands according to one of claims 1 to 10, characterized in that:

each of said N first variable frequency band extractors is composed of N-1 first variable frequency band elimination filters, connected in cascade, respectively eliminating the respective extracted frequency bands of the remaining N-1 first variable frequency band extractors; and each of said N second variable frequency band extractors is composed of N-1 second variable frequency band elimination filters, connected in cascade, respectively eliminating the respective extracted frequency bands of the remaining N-1 second variable frequency band extractors.

12. The feed forward amplifier for multiple frequency bands according to one of claims 1 to 10, characterized in that:

said N first variable frequency band extractors are composed of first variable frequency band pass filters taking the center frequencies of the respective extracted frequency bands as the center frequencies; and said N second variable frequency band extractors are composed of second variable frequency band pass filters taking the center frequencies of the respective extracted frequency bands as the center frequencies.

13. The feed forward amplifier for multiple frequency bands according to one of claims 1 to 10, characterized in that:

each of said N first variable frequency band extractors or each of said N second variable frequency band extractors has respective center frequencies controlled by said frequency band controller.

14. The feed forward amplifier for multiple frequency bands according to one of claims 1 to 10, characterized in that:

each of said N first variable frequency band extractors or each of said N second variable frequency band extractors has respective bandwidths controlled by said frequency band controller.

* * * * *